United States Patent
Kreuter et al.

(10) Patent No.: US 9,640,972 B2
(45) Date of Patent: May 2, 2017

(54) CONTROLLED SWITCH-OFF OF A POWER SWITCH

(71) Applicant: Infineon Technologies AG, Neubiberg (DE)

(72) Inventors: Hans-Peter Kreuter, Villach (AT); Christian Djelassi, Villach (AT); Markus Ladurner, Villach (AT); Robert Illing, Villach (AT)

(73) Assignee: Infineon Technologies AG, Neubiberg (DE)

( * ) Notice: Subject to any disclaimer, the term of this patent is extended or adjusted under 35 U.S.C. 154(b) by 351 days.

(21) Appl. No.: 14/226,762

(22) Filed: Mar. 26, 2014

(65) Prior Publication Data
US 2015/0280416 A1 Oct. 1, 2015

(51) Int. Cl.
| | |
|---|---|
| H02H 3/08 | (2006.01) |
| H03K 17/082 | (2006.01) |
| H01H 83/00 | (2006.01) |
| H02H 3/02 | (2006.01) |
| H02H 9/04 | (2006.01) |
| H02H 3/087 | (2006.01) |
| H03K 17/16 | (2006.01) |
| H01H 83/04 | (2006.01) |
| H02H 3/18 | (2006.01) |

(52) U.S. Cl.
CPC .............. *H02H 3/08* (2013.01); *H01H 83/00* (2013.01); *H01H 83/04* (2013.01); *H02H 3/025* (2013.01); *H02H 3/087* (2013.01); *H02H 9/04* (2013.01); *H03K 17/082* (2013.01); *H03K 17/0822* (2013.01); *H03K 17/0826* (2013.01); *H03K 17/166* (2013.01); *H02H 3/18* (2013.01)

(58) Field of Classification Search
CPC ........ H02H 3/025; H02H 3/027; H02H 9/001; H02H 9/002; H02H 2/08; H02H 9/02; H03K 17/08122; H03K 17/166; H03K 17/167; H03K 17/0814–17/0828
USPC ........................................ 361/93.9
See application file for complete search history.

(56) References Cited

U.S. PATENT DOCUMENTS

| | | | | |
|---|---|---|---|---|
| 5,608,595 A | * | 3/1997 | Gourab | H03K 17/0826 361/101 |
| 6,172,383 B1 | * | 1/2001 | Williams | H02M 1/32 257/173 |
| 2006/0227478 A1 | * | 10/2006 | Herr | H03K 17/0822 361/93.1 |

(Continued)

OTHER PUBLICATIONS

Horn, W. et al., "Thermally Optimized Demagnetization of Inductive Loads," Proceeding of the 30th European Solid-State Circuits Conference (ESSCIRC), Sep. 21-23, 2004, 4 pp.

(Continued)

*Primary Examiner* — Stephen W Jackson
*Assistant Examiner* — Christopher Clark
(74) *Attorney, Agent, or Firm* — Shumaker & Sieffert, P.A.

(57) ABSTRACT

A power circuit is described that includes a switch coupled to a resistive-inductive-capacitive load and a driver coupled to the switch. The driver is configured to detect an emergency event within the power circuit. After detecting the emergency event within the power circuit, the driver is further configured to perform a controlled emergency switch-off operation of the switch to minimize the maximum temperature of the switch during the detected emergency event and switch-off operation.

13 Claims, 14 Drawing Sheets

(56) References Cited

U.S. PATENT DOCUMENTS

| | | | | |
|---|---|---|---|---|
| 2009/0256618 | A1* | 10/2009 | Yamawaki | H03K 17/168 327/377 |
| 2013/0027120 | A1* | 1/2013 | Lo | G11O 5/148 327/536 |
| 2014/0321021 | A1* | 10/2014 | Sander | H02H 3/087 361/93.9 |

OTHER PUBLICATIONS

Nelhiebel, M. et al., "A reliable technology concept for active power cycling to extreme temperatures," 22nd European Symposium on Reliability of Electron Devices, Failure Physics and Analysis (ESREF), Oct. 3-7, 2011, 4 pp.

\* cited by examiner

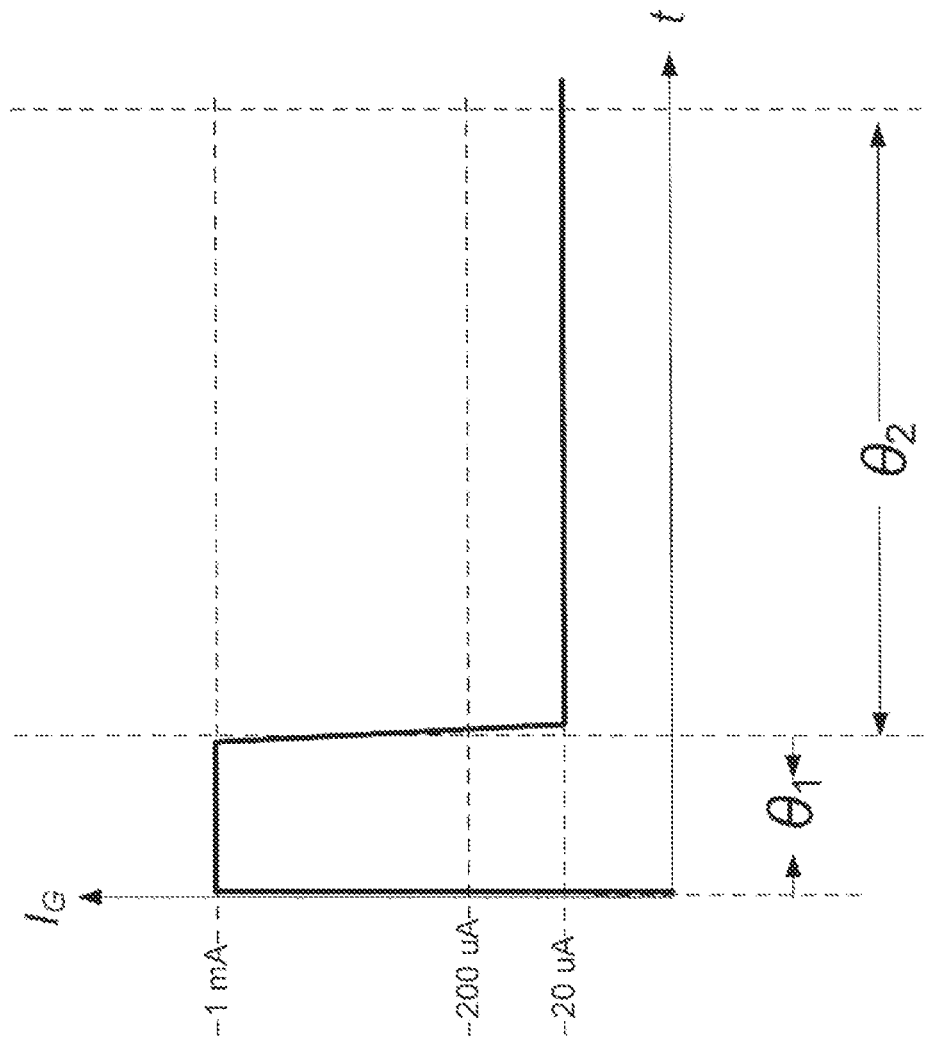

CONTROLLED SWITCH-OFF OF A POWER SWITCH

TECHNICAL FIELD

This disclosure relates to techniques for controlling the shutdown switch.

BACKGROUND

Inductive energy can accumulate in a power circuit (e.g., switch-based power supplies, automotive applications, and the like) that relies on power switches, such as a power MOSFET (Metal Oxide Field Effect Transistor) type, semiconductor-based switch device, to control the flow of electrical current to a resistive-capacitive-inductive load. The switch-off of a power switch may stop the accumulation of inductive energy and allow inductive energy that accumulated prior to the switch-off. If a short occurs at the resistive-capacitive-inductive load, accumulated inductive energy can begin to dissipate which may potentially damage or even destroy the power switch or the other portion of the power circuit.

Power circuit emergency events (e.g., over load events, short circuits, and the like) can lead to the greatest accumulation and subsequent dissipation of inductive energy in a power circuit. To prevent energy dissipation and resulting thermal damage from occurring at a power switch, some power circuits may include a "Zener diode gate clamp" (referred to simply as "a Zener clamp") across the drain and gate terminals of the power switch. During an emergency event, a power circuit may try to minimize the amount of inductive energy that accumulates as a result of the emergency event by switching-off the power circuit's switches as quickly as possible. When a power switch that is protected by a Zener clamp is switched-off as fast as possible during an emergency event, a rise in the junction temperature of the power switch will occur during the period of time when the Zener clamp transitions to clamping operation. The momentary temperature rise may damage and even destroy a power switch if the temperature exceeds the maximum temperature rating of the power switch.

SUMMARY

In general, techniques and circuits are described for controlling the discharge the gate of a power switch during an emergency switch-off operation to minimize the maximum junction temperature of the power switch during an emergency event. A power circuit may include a power switch to control the flow of current to a resistive-capacitive-inductive load. A driver of the power switch may drive a gate current to charge the power switch, for example, to drive the power switch on and off. During an emergency event (e.g., a shorted load, an overvoltage, etc.) the power circuit may open the power switch to protect the power switch, and the load.

In some power circuits, in an emergency event, the power circuit performs a fast emergency switch-off operation at the switch to discharge the gate charge of the switch in as short amount of time as possible. The fast emergency switch-off may result in a rise in the junction temperature of the switch and/or may require the use of a clamp to handle the dissipation of inductive energy that accumulated in the power circuit prior to the emergency event. To eliminate the need for such a clamp and to minimize the maximum junction temperature of a switch, a driver of a power switch, as described herein, may be configured to detect an emergency event within a power circuit. After detecting the emergency event within the power circuit, the driver may be configured to perform a controlled emergency switch-off operation of the power switch to minimize the maximum temperature of the power switch during the emergency event and switch-off operation.

In one example, the disclosure is directed to a method that includes detecting, by a driver, an emergency event within a power circuit that includes a switch for controlling current to a resistive-inductive-capacitive load. The method further includes performing, by the driver, a controlled emergency switch-off operation of the switch in response to a detected emergency event.

In another example, the disclosure is directed to a power circuit that includes a switch coupled to an inductive load. The power circuit further includes a driver for controlling the switch, wherein the driver is configured to perform a controlled emergency switch-off of the switch in response to an emergency event detected within the power circuit.

In another example, the disclosure is directed to a power circuit that includes a switch coupled to an inductive load and a driver coupled to the switch. The driver includes means for detecting an emergency event within the power circuit, and means for performing a controlled emergency switch-off operation of the switch in response to the detected emergency event. The details of one or more examples are set forth in the accompanying drawings and the description below. Other features, objects, and advantages of the disclosure will be apparent from the description and drawings, and from the claims.

BRIEF DESCRIPTION OF DRAWINGS

FIG. 9 is a timing diagram illustrating various timing characteristics of the example drivers shown in FIGS. 6 and 7, in accordance with one or more aspects of the present disclosure.

DETAILED DESCRIPTION

Figure 1:
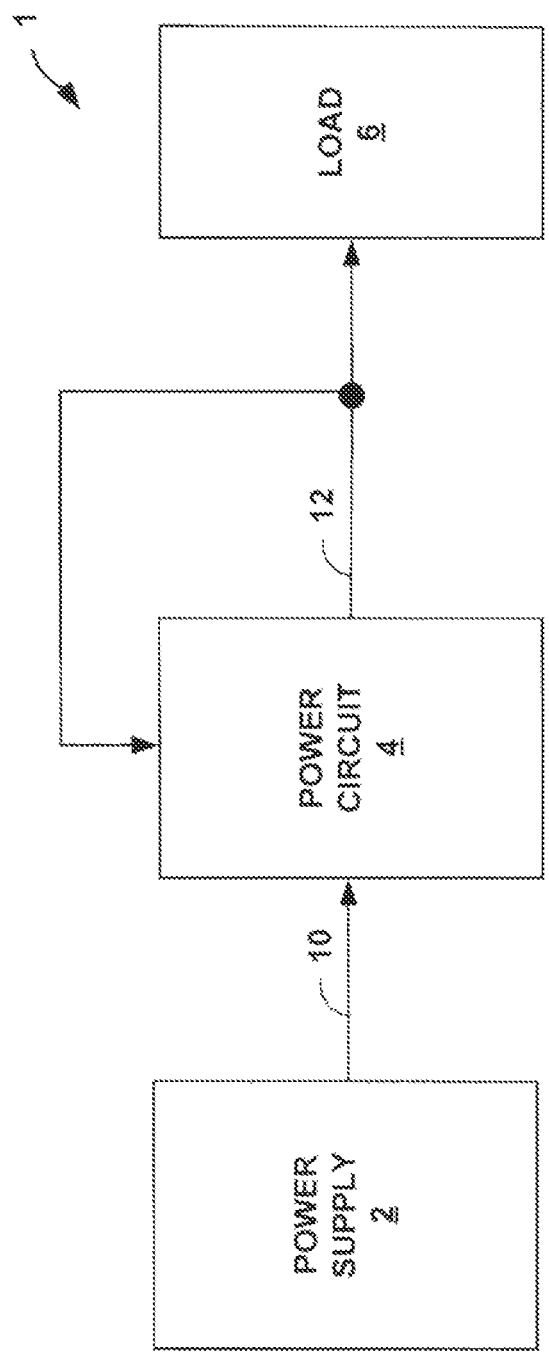
FIG. 1 is a block diagram illustrating an example system for controlling current to a resistive-capacitive-inductive load, in accordance with one or more aspects of the present disclosure.

A power MOSFET (Metal Oxide Field Effect Transistor) is one example of a semiconductor-based "power switch" that can be used in a power circuit (e.g., switch-based power supplies, automotive applications, and the like) to control the flow of electrical current to a resistive-capacitive-inductive load (e.g., relays, valve solenoids, inductive actuators, wire harness, LED module, motor, and the like). A power circuit may "switch-on" and "switch-off" one or more power switches to control the direction of electrical current flow that passes through a resistive-capacitive-inductive load (e.g., an electric motor, a light source, an electrical wire harness in case of a shorted load, and the like).

During normal operation, when a power circuit supplies current to a resistive-capacitive-inductive load, current spikes may occur that cause inductive energy to accumulate in the power circuit. Emergency events (e.g., high current spikes, short circuits, and the like) can lead to the greatest accumulation and subsequent dissipation of inductive energy. During an emergency event the amount of inductive energy that accumulates in the power circuit may exceed the maximum amount of energy that the power circuit can safely dissipate at one time during switch-off of a power switch. As a result, the dissipation of the energy may cause overheating and damage to portions of the power circuit. A power circuit may try to minimize the amount of inductive energy that builds up in the circuit during an emergency event, and prevent components of the circuit from being damaged, by performing a "fast emergency switch-off" (also referred to herein as a "fast emergency shutdown") of a power switch. During a fast emergency switch-off, the power circuit may more quickly discharge the gate charge of a power switch than the circuit would otherwise in normal operation, in an attempt to "switch-off" the power switch as fast as possible.

To prevent energy dissipation and resulting thermal damage from occurring at the power switch during an emergency event, some power circuits may include a "Zener diode gate clamp" (referred to simply as "Zener clamp"). A power circuit may arrange a Zener clamp between the drain and the gate of a power switch, such that the voltage across the Zener clamp ("$V_{CL}$") is equal to the voltage between the drain and gate of the power switch ("$V_{DG}$"). When $V_{DG}$, $V_{CL}$ exceeds the breakdown voltage associated with the Zener clamp, the Zener clamp may drive the power switch into clamping operation by shorting the drain and gate terminals of the power switch and conducting current away from the drain of the power switch. In other words, a Zener clamp may limit the nodal voltage between drain and source of a power switch to prevent the uncontrollable breakdown of a power switch induced by an overvoltage condition.

As discussed above, to dissipate accumulated inductive energy during a short load or other emergency event, a power circuit may perform a "fast emergency switch-off" of the power switch by discharging the gate charge of a power switch as fast as possible. Unfortunately, when switching-off, as fast as possible, a power switch that is being protected by a Zener clamp, a rise in the junction temperature of the power switch can occur as the Zener clamp transitions from a non-clamping operation to clamping operation. The time in which the Zener clamp transitions from non-clamping to clamping operation may be referred to herein as the "transition period." The momentary temperature rise during the transition period of a Zener clamp can damage and even destroy a power switch, especially if the rise in temperature exceeds the maximum temperature rating of the power switch.

In accordance with techniques and circuits of this disclosure, to dissipate inductive energy during an emergency event (e.g., a short at a resistive-capacitive-inductive load), a shutdown unit of a power circuit may perform a "controlled emergency switch-off" a power switch, that may or may not be protected by a Zener clamp. By performing a "controlled emergency switch-off" rather than a "fast emergency switch-off", the shutdown unit may minimize the junction temperature of the power switch during the emergency event. In some examples, even if the power switch is protected by a Zener clamp, the techniques and circuits may provide for the controlled emergency switch-off of a power switch that does not place the Zener clamp into clamping operation, and as such, prevents an associated rise in the junction temperature of the power switch. In addition, in some examples, the techniques and circuits may provide for a controlled emergency switch-off of a power switch, by controlling the gate charge trajectory, such that a Zener clamp may no longer be necessary to protect the power switch from thermal destruction caused by inductive energy dissipation.

FIG. 1 is a block diagram illustrating system 1 for controlling current to load 6, in accordance with one or more aspects of the present disclosure. FIG. 1 shows system 1 as having three separate and distinct components shown as power supply 2, power circuit 4, and resistive-capacitive-inductive 6 (referred to simply as "load 6"), however system 1 may include additional or fewer components. For instance, power supply 2, power circuit 4, and load 6 may be three individual components or may represent a combination of one or more components that provide the functionality of system 1 as described herein.

System 1 includes power supply 2, which provides electrical power to system 1. Numerous examples of power supply 2 exist and may include, but are not limited to, power grids, generators, transformers, batteries, solar panels, windmills, regenerative braking systems, hydro-electrical or wind-powered generators, or any other form of devices that are capable of supplying electrical power via link 10, to power circuit 4.

System 1 includes power circuit 4 that, represents a circuit which includes one or more power switch type switch devices that control the flow of electrical current across link 12 to load 6. In some examples, power circuit 4 includes multiple power switches, for example arranged in h-bridge or half-bridge configurations to control the flow of electrical current to load 6. In some examples, power circuit 4 may operate as a DC-to-DC, DC-to-AC or AC-to-DC converter. In some examples, power circuit 4 may be a switch-based power converter that converts one form of electrical power provided by power supply 2 into a different and usable form, of electrical power for powering load 6. For example, power circuit 4 may be a step-up converter that outputs power with a higher voltage level than the voltage level of input power received by the step-up converter (e.g., one example of such step-up converter may be referred to as a boost converter) or may instead comprise a step-down converter configured to output power with a lower voltage level than the voltage level of input power received by the step-down converter (e.g., one example of such a step-down converter may be referred to as a buck converter). In still other examples, power circuit 4 may be a step-up and step-down converter (e.g., a buck-boost converter) that is capable of outputting power with a voltage level that is higher or lower level than the voltage level of the power input received by the step-up and step-down converter.

System 1 further includes load 6. Load 6 represents any resistive-capacitive-indicative type load capable of receiving electrical current being output from power circuit 4. In some examples, load 6 receives electrical current from power circuit 4 after the current passes through a filter (not shown). In some examples, load 6 uses the electrical current from power circuit 4 to perform a function. Numerous examples of load 6 exist and may include, but are not limited to, relays, valve solenoids, inductive actuators, wire harness, LED modules, motors, computing devices and related components, such as microprocessors, electrical components, circuits, laptop computers, desktop computers, tablet computers, mobile phones, battery chargers, speakers, lighting units, automotive/marine/aerospace/train related components, motors, transformers, or any other type of electrical device and/or circuitry that receives a voltage or a current from a power converter.

Power supply 2 may supply a voltage or current to power circuit 4 over link 10. Load 6 may receive electrical current from power circuit 4, over link 12. Links 10 and 12 represent any medium capable of conducting electrical voltage and current from one location to another. Examples of links 10 and 12 include, but are not limited to, physical and/or wireless electrical transmission mediums such as electrical wires, electrical traces, conductive gas tubes, twisted wire pairs, wire harnesses, and the like. Each of links 10 and 12 provide electrical coupling between, respectively, power supply 2 and power circuit 4, and power circuit 4 and load 6. In addition, link 12 provides a feedback loop or circuit for carrying information to power circuit 4 associated with the characteristics of the current output of power circuit 4. For instance, feedback control (e.g., current sensing) circuitry of power circuit 4 may detect the voltage or current level of the power output at link 12 and driver/control logic of converter 4 may adjust the power output at link 12 based on the detected voltage or current level to cause the power output to have a different voltage or current level that fits within a voltage or current level tolerance window required by load 6.

Figure 2:
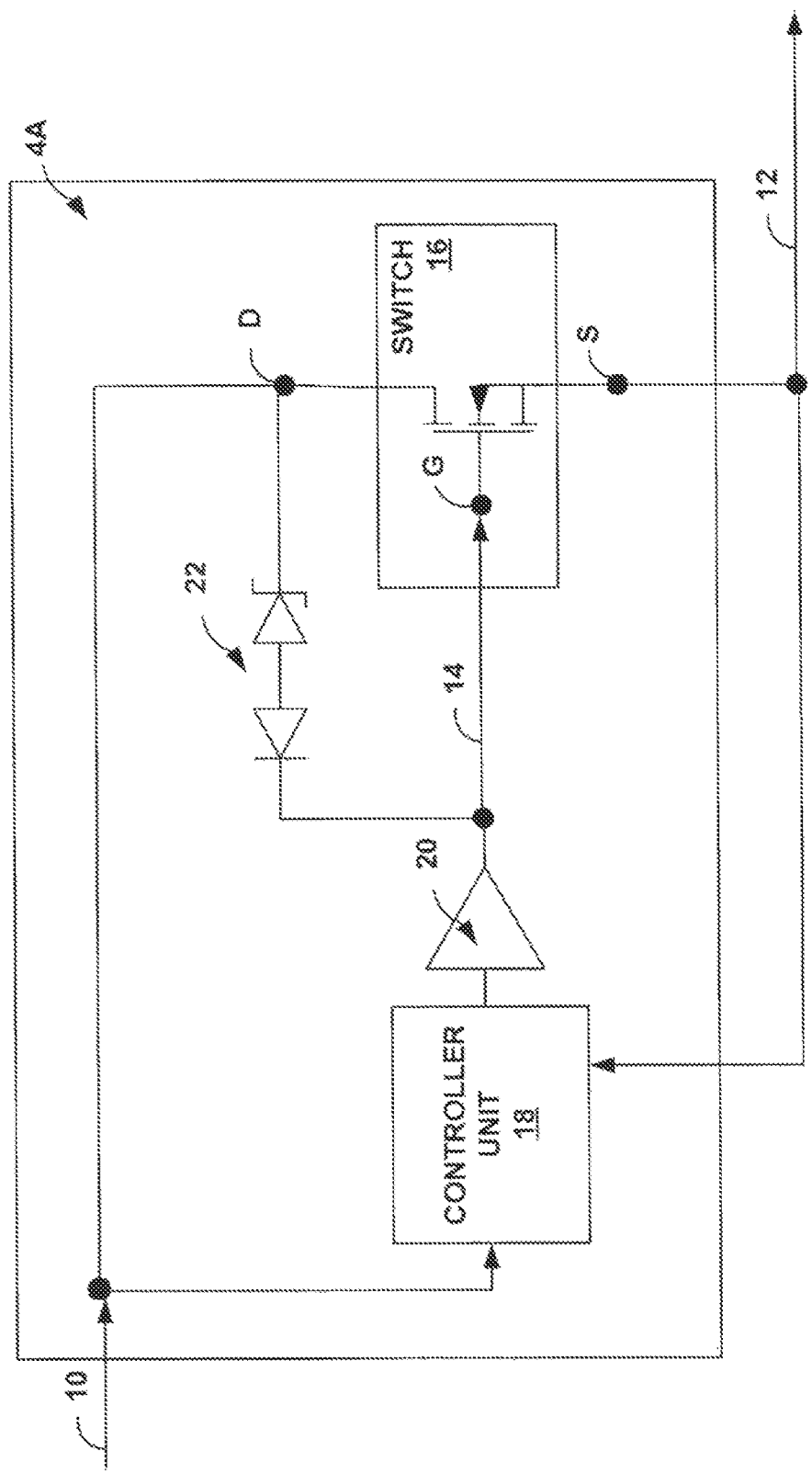
FIG. 2 is a block diagram illustrating one example of a power circuit of the example system shown in FIG. 1.

FIG. 2 is a block diagram illustrating power circuit 4A as one example of power circuit 4 of system 1 shown in FIG. 1. FIG. 2 is described below within the context of system 1 of FIG. 1.

Power circuit 4A represents an electrical circuit for controlling the flow of current to load 6 coupled to link 12. Power circuit 4A is shown as having various electrical components, including: switch 16, controller unit 18, driver 20, and clamp 22. Power circuit 4A may supply a current across link 12 based on a voltage or current level received via link 10. Power circuit 4A may include additional or fewer electrical components than those illustrated in FIG. 2. For instance, in some examples, switch 16, controller unit 18, driver 20, and clamp 22 reside on a single semiconductor die, electrical component, or circuit while in other examples, more than two dies, components, and/or circuits provide power circuit 4A with the functionality of witch 16, controller unit 18, driver 20, and clamp 22. Although only single individual components are shown, power circuit 4A may include one or more power switch type switches and other types of switch devices, one or more gate drivers, one or more half-bridge circuits, one or more H-bridge circuits, one or more input filters, one or more output filters, one or more capacitors, one or more resistors, one or more transistors, one or more transformers, one or more inductors, one or more clamping elements, and/or one or more other electrical components or circuits that are arranged within power circuit 4A for controlling the current flow across link 12.

Power circuit 4A is described in more detail below; however, in general, power circuit 4A may receive power, from supply 2, at a certain voltage level at line 10 and output power, to load 6, at a particular current level at link 12. Power circuit 4A may rely on controller unit 18 to control the operation of switch 16 by issuing commands to driver 20 and based on the commands from controller unit 18, driver 20 may either supply or inhibit a gate charge across link 14 to control the state (e.g., on-state, off-state) of switch 16.

In some examples, driver 20 may include an "ON/OFF" block that controls the charging and discharging of the gate charge at link 14. For instance, within the ON/OFF block of driver 20, two or more current mirrors may deliver or otherwise apply the charge and discharge currents for normal switching operations to link 14.

FIG. 2 shows power switch 16 (e.g., a power MOSFET (Metal Oxide Field Effect Transistor)) arranged within power circuit 4A as a semiconductor-based switch device. Switch 16 is one example of a semiconductor-based switch that can be used by power circuit 4A to control the flow of electrical current to an inductive load (e.g., relays, valve solenoids, inductive actuators, wire harness, LED module, motor, and the like) coupled to link 12. In some examples, switch 16 may be a power MOSFET, an Insulated-Gate Bipolar transistor (IGBT), or any other semiconductor based controllable switch.

FIG. 2 shows the drain, the gate, and the source of switch 16 as being labeled, respectively, "D", "G", and "S". The drain of switch 16 is coupled to link 10 and the source of switch 16 is coupled to link 12. Whether switch 16 is switched-on or is switched-off depends on the amount of gate charge traveling across link 14 to the gate of switch 16. For example, a high gate charge at link 14 may cause switch 16 to "switch-on" and conduct a current and a low gate charge at link 14 may cause switch 16 to "switch-off" stop conducting current.

Controller unit 18 of power converter 6 may provide a driver control signal or drive command to driver 20 that causes driver 20 to produce a gate charge at link 14 for controlling the state of switch 16. For example, controller unit 18 may generate a pulse-width-modulation (PWM) signal or other signal associated with some other suitable modulation technique, based on the voltage level of a power input at link 10 or the current level of a power output at link 12. In other examples, controller unit 18 may generate a pulse-density-modulation (PDM) signal or other signal associated with some other suitable modulation technique, based on the voltage level of a power input detected at link 10 and/or link 12. In any event, driver 20 may receive the signal outputted by controller unit 18 and in response to the signal from controller unit 18, may produce a gate control signal that drives switch 16 (e.g., causes switch 16 to transition between operating in an on-state and an off state or said differently cause switch 16 to turn-on or turn-off). In other words, controller unit 18 may provide driver 20 with a driver control signal for modulating (e.g., controlling) the switching pattern of switches 16 of power circuit 4A to control the level of current that power circuit 4A outputs at link 12.

Controller unit 18 may comprise any suitable arrangement of analog and/or digital hardware, software, firmware, or any combination thereof, to perform the techniques attributed to controller unit 18 herein. For example, controller unit 18 may include any one or more microprocessors, signal processors, application specific integrated circuits (ASICs), field programmable gate arrays (FPGAs), or any other equivalent integrated, digital, analog, or discrete logic circuitry, as well as any combinations of such components. When controller unit 18 includes software or firmware, controller unit 18 further includes digital and/or analog hardware for storing and executing the software or firmware, such as one or more processors or processing units. In general, a processing unit may include one or more microprocessors, signal processors, ASICs, FPGAs, or any other equivalent integrated, digital, analog, or discrete logic circuitry, as well as any combinations of such components. Although not shown in FIG. 2, controller unit 18 may include a memory configured to store data. The memory may include any volatile or non-volatile media, such as a random access memory (RAM), read only memory (ROM), non-volatile RAM (NVRAM), electrically erasable programmable ROM (EEPROM), flash memory, and the like. In some examples, the memory may be external to controller unit 18 and/or power circuit 4A, e.g., may be external to a package in which controller unit 18 and/or power circuit 4A is housed.

In operation, controller unit 18 of power circuit 4A may "switch-on" and "switch-off" switch 16 to control the direction and/or amount of electrical current that passes out of power converter 4A at link 12. During normal operation, electrical noise, electrical interference, electrical shorts, and other electrical anomalies (e.g., due to characteristics of the operating environment of power circuit 4A) may arise within the links and connections of the various components of power circuit 4A that cause the accumulation of inductive energy at load 6. For example, a current spike may occur between the drain and source of switch 16 that causes inductive energy to accumulate at load 6. Controller unit 18 may detect the current spike and/or the accumulation of inductive energy at load 6. Controller unit 18 may cause driver 20 to switch-off switch 16 to stop the further accumulation of inductive energy at load 6 and to allow time for the accumulated inductive energy to dissipate from load 6 as heat.

At times, during normal operation, a short may occur across load 6, or inductive energy may accumulate in power circuit 4A. If energy has accumulated at load 6 prior to the short, or if the amount of accumulated inductive energy in power circuit 4A is more than the amount of inductive energy that load 6 can safely handle dissipating, the accumulated inductive energy will dissipate at some other portion of power circuit 4A. To prevent the dissipation of inductive energy from switch 16, power circuit 4A includes clamp 22.

Clamp 22 is shown as a Zener diode based clamping element arranged across the drain and gate of switch 16. Clamp 22 in some examples may be a "two-way" clamp comprising two or more Zener diodes oriented in opposite directions and in some examples, only a single Zener diode may be used. Clamp 22 includes a diode arranged back-to-back (e.g., in opposite direction) and in-series with a Zener diode to block current from the gate to the drain of switch 16 and/or to block current from the drain to the gate of switch 16. In some examples, other variations of clamp 22 may be used. For example, clamp 22 may comprise one or more Zener diodes, one or more diodes, transient voltage suppressant diodes, avalanche diodes, or other electrical circuits and/or components that may be used as a clamp to suppress a voltage and/or current across the drain and gate terminals of switch 16. Clamp 22 may have properties or characteristics that rely on a threshold or other activation criteria of clamp 22 that, if satisfied, cause a current path to form through clamp 22. For example, if the voltage level across clamp 22 exceeds a breakdown voltage associated with clamp 22, a current path may form through clamp 22 that may otherwise not exist if the voltage across clamp 22 remains less than the breakdown voltage of clamp 22.

Clamp 22 is arranged within power circuit 4A to generally protect switch 16 from potential thermal damage from heat dissipation attributed to the dissipation of accumulated inductive energy. For example, FIG. 2 shows clamp 22 arranged between the drain and the gate of switch 16, such that the voltage across clamp 22 ("$V_{CL}$") equals the voltage between the drain and gate of switch 16 ("$V_{DG}$"). When $V_{DG}$ and $V_{CL}$ exceed the breakdown voltage associated with clamp 22, clamp 22 may drive switch 16 into clamping operation by shorting the drain and gate of switch 16 and conducting current away from the drain of switch 16. As a result, when clamp 22 transitions to clamping operation, clamp 22 will divert charge away from switch 16 so that heat dissipation can occur at clamp 22 and not at switch 16.

Although not shown in FIG. 2, in some examples, power circuit 4A may include an external freewheeling diode to handle the dissipation of inductive energy (e.g., when a short occurs at load 6). The external freewheeling diode may be configured such that a freewheeling current path is created outside the normal flow of current when a short circuit within the circuit occurs. For example, rather than accumulating energy at and dissipating energy from switch 16, a wire harness (e.g., link 12), or some other portion of the power circuit, inductive energy may accumulate at and dissipate from the freewheeling current path created by the freewheeling diode.

An external freewheeling diode may be disadvantageous to a power circuit such as power circuit 4A, for at least three reasons: first, an external freewheeling diode is an extra component and can increase the cost and complexity of a power circuit. Second, an external freewheeling diode may reduce or slow the switching speed of the power switches (e.g., an amount of time t0 transition between and on-state of the power switch and an off-state of the power switch) caused by a low-diode forward-biased voltage during inductive turn-off. Third, in case of accidental supply polarity reversal, an external freewheeling diode can cause a short in the supply of the power circuit and/or the inductive load. To prevent reverse polarity, additional reverse polarity protections may be required at the supply of the power circuit, which may increase the complexity and cost to design and manufacture the power circuit.

In some examples, rather than rely on clamp 22, power circuit 4A may rely on the intrinsic "body diode" of switch 16 to dissipate accumulated inductive energy. For example, switch 16 may have an intrinsic "body diode" that, under certain conditions, conducts current according to what is commonly referred to as the "avalanche effect." When the voltage across the drain and source of switch 16 (referred to simply as "$V_{DS}$") exceeds the breakdown voltage of switch 16 (referred to simply as "$V_{BDS}$", also known as a voltage threshold) the intrinsic body diode of the power switch may "breakdown" and conduct electrical current through the body diode (e.g., from the drain of switch 16 to the source of switch 16). In some instances, avalanche breakdown of the intrinsic body diode of switch 16 may dissipate small amounts of inductive energy. However, if the amount of accumulated inductive energy exceeds the maximum amount of energy that switch 16 can safely dissipate, damage and even destruction of switch 16 would occur.

Figure 3:
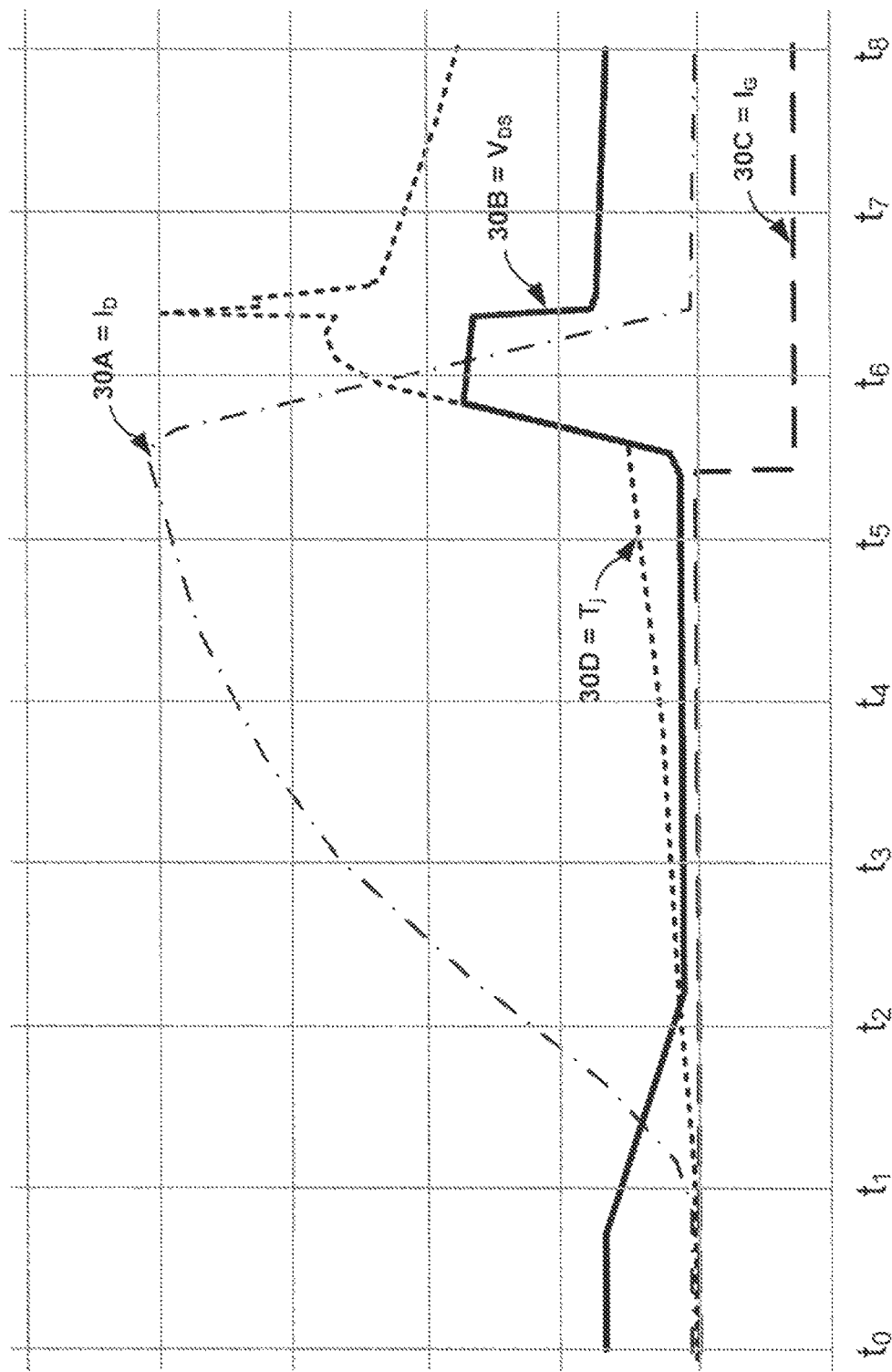
FIG. 3 is a timing diagram illustrating various timing characteristics of the power circuit shown in FIG. 2, in accordance with one or more aspects of the present disclosure.

FIG. 3 is a timing diagram illustrating various timing characteristics of power circuit 4A shown in FIG. 2, in accordance with one or more aspects of the present disclosure. Plots 30A-30D of FIG. 3 illustrate voltage, current, and temperature levels of portions of switch 16 as illustrated in FIG. 2 during an emergency event (e.g., a short of load 6) between times t0 and t8. Plot 30A shows the current level ("$I_D$") at the drain of switch 16 during the emergency event and plot 30B shows the voltage level ("$V_{DS}$") between the drain and source of switch 16 during the emergency event. Plot 30C shows the current level ("$I_G$") at the gate of switch 16 during the emergency event and plot 30D shows the junction temperature ("$T_j$") of switch 16 during the emergency event.

In general, emergency events (e.g., particularly high current spikes, short circuits, shorts across load 6, and the like) may occur at various times during normal operation of power circuit 4A. These emergency events can cause large accumulations of inductive energy within power circuit 4A that, when dissipated, can lead to catastrophic thermal damage to the components of power circuit 4A. For example, during an emergency event the amount of inductive energy that accumulates in power circuit 4A may exceed the maximum amount of energy that power circuit 4A can safely dissipate at one time. As a result, the dissipation of the energy may cause portions of power circuit 4A to overheat and be damaged.

Controller unit 18 may rely on $I_D$ of switch 16 and/or $V_{DS}$ of switch 16 to determine whether or not an emergency event is occurring or is about to occur. In some examples, if controller 18 determines that an emergency event is occurring within power circuit 4A, controller unit 18 of power circuit 4A may perform a "fast emergency switch-off" (also referred to herein as a "fast emergency shutdown") of switch 16. Controller unit 18 may generate signals that command driver 20 of power circuit 4A to perform the fast emergency switch-off of switch 16 by discharging the gate charge of switch 16 ("$I_G$") as quickly or as short amount of time as possible. For example, controller unit 18 may issue a command to driver 20 that causes driver 20 to immediately sink and discharge the current at link 14 away from the gate of switch 16, as fast as possible.

By performing a fast emergency switch-off of switch 16 in response to detecting an emergency event at power circuit 4A, controller unit 18 may minimize the amount of inductive energy that builds up in power circuit 4A during the emergency event and may further prevent components of power circuit 4A from being damaged. Said differently, by performing a fast emergency switch-off, controller unit 18 can stop further accumulation of inductive energy during the emergency event and allow inductive energy that accumulated in power circuit 4A prior to the emergency event time t0 dissipate (e.g., as heat) from clamp 22.

For example, FIG. 3 shows that an emergency event may begin at time t0 and last through time t8. Between times t1 and t2, controller 18 may detect a rise in $I_D$ of switch 16 (shown by plot 30A) and/or a decline in the $V_{DS}$ of switch 16 (shown by plot 30B) and based on the rise of $I_D$ and/or fall of $V_{DS}$, controller 18 may determine that an emergency event is occurring at power circuit 4A.

Plots 30A and 30D show that, between times t2 and t5, as $I_D$ of switch 16 increases, $T_j$ of switch 16 may also increase. At some point in time after t0, and in response to controller unit 18 determining that an emergency event is occurring at power circuit 4A, controller unit 18 may command driver 20 to perform a fast emergency switch-off of switch 16. Controller unit 18 may command driver 20 to quickly discharge all current from link 14 in an attempt to zero $I_G$ of switch 16 in order to "switch-off" switch 16 as quickly as possible. For example, between times t5 and t6, plot 30C shows a sharp decrease in $I_G$ of switch 16 as a result of driver 20 discharging all current from link 14.

A fast emergency switch-off of switch 16 can quickly stop further inductive energy from accumulating in power circuit 4A and can quickly reduce the amount of current $I_D$ of switch 16. For example, plots 30A and 30C, between times t5 and t7, show a sharp or large negative decrease to $I_D$ of switch 16 after the discharge of $I_G$ of switch 16. Since $I_D$ of switch 16 also corresponds to the amount of current through load 6 ("$I_L$"), a sharp, negative decrease to $I_D$ of switch 16 corresponds to an equivalent sharp, negative decrease to $I_L$ of load 6. Sharp, negative decreases to $I_D$ (e.g., a high $dI_D/dt$) of switch 16 and $I_L$ of load 6 will induce a sharp, negative decrease in the voltage (e.g., a high $dV_L/dt$) across the load 6 ("$V_L$"). A sharp, negative decrease to $V_L$ of load 6 and/or $I_L$ of load 6 may result in the activation of clamp 22 and the driving of switch 16 into clamping operation. By driving switch 16 into clamping operation, clamp 22 may quickly reduce $V_{DS}$ of switch 16. For example, plot 30B between times t5 and t7 shows a rapid decrease in $V_{DS}$ of switch 16 as a result of clamp 22 driving switch 16 into clamping operation.

Additionally, as a result of clamp 22 driving switch 16 into clamping operation, a rise in the junction temperature ("$T_j$") of switch 16 can occur during the fast emergency switch-off of switch 16 and time when clamp 22 transitions to clamping operation. For example, plot 30D shows a large rise in $T_j$ of switch 16 between times t6 and t7 when the reduction of $V_{DS}$ of switch 16 shown in plot 30B is the sharpest. The momentary rise in the junction temperature $T_j$ of switch 16 can damage and even destroy switch 16 if the maximum temperature of the temperature rise exceeds the maximum temperature rating of switch 16. A significant amount of the temperature rise may be considered as measurement artifact for controlling the shutdown of switch 16.

Therefore, although a fast emergency switch-off (e.g., a switch-off having timing characteristics similar to those shown by plots 30A-30D) may result in a quicker dissipation of inductive energy from power circuit 4A during an emergency event, the rise in junction temperature shown in plot 30D that is directly caused by the fast emergency switch-off may result in unnecessary thermal stress being placed on switch 16. As a consequence of the potential large temperature rises that switch 16 may experience during fast emergency switch-off, power circuit 4A, may require that switch 16 be a more expensive power switch type switch device that can withstand the higher maximum junction temperature that may occur during the an emergency event.

Figure 4:
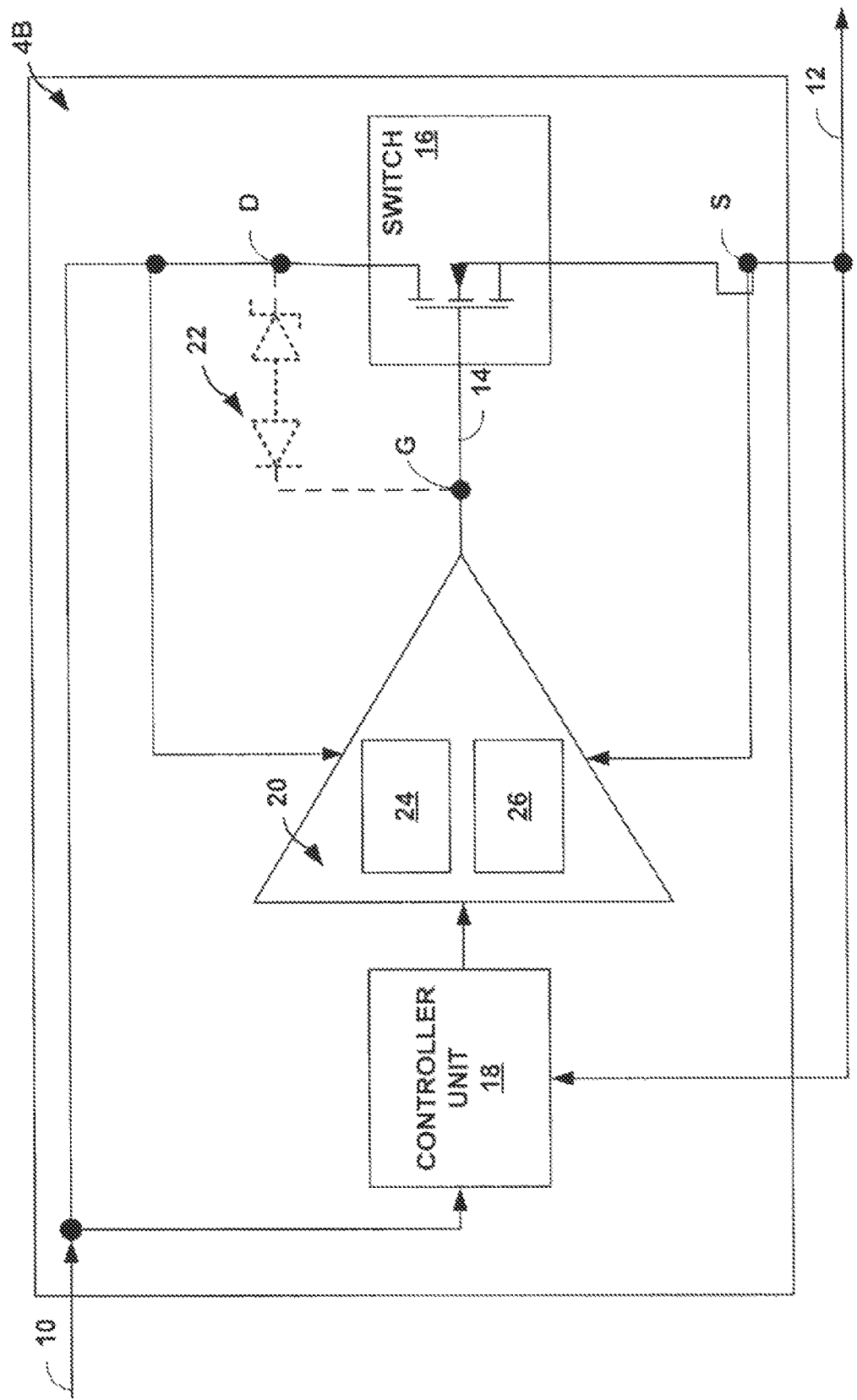
FIG. 4 is a block diagram illustrating an additional example of a power circuit of the example system shown in FIG. 1.

FIG. 4 is a block diagram illustrating power circuit 4B as one additional example of power circuit 4 of system 1 shown in FIG. 1. FIG. 4 is described below within the context of system 1 of FIG. 1.

Power circuit 4B of FIG. 4 includes switch 16 arranged between links 10 and 12 for controlling the flow of current to load 6. Controller unit 18 may generate driver commands that cause driver 20 to switch-on and/or switch-off switch 16. Driver 20 is shown as having shutdown unit 24 and on/off unit 26 to control switch 16, in accordance with the aspects of this disclosure. Clamp 22 of power circuit 4B is illustrated as an optional component of power circuit 4B for preventing switch 16 from dissipating inductive energy during an emergency event. As is described below, in accordance with the aspects of this disclosure, a power circuit, such as power circuit 4B may not need a component such as clamp 22.

As shown in FIG. 4, driver 20 is coupled to each of the drain, the source, and the gate of switch 16 and can receive driver control commands or signals from controller unit 18. ON/OFF unit 26 of driver 20 provides gate charge ("$I_G$") to switch 16 via link 14 to control the switch-on and switch-off of switch 16 during normal operation. Rather than have controller unit 18 and driver 20 attempt to drive a fast emergency switch-off of switch 16 during an emergency event (and possibly risk damaging switch 16 and/or causing switch 16 to transition to clamping operation) Shutdown unit 24 of driver 20 may automatically initiate a controlled emergency switch-off operation of switch 16 to discharge the gate charge of switch 16. A controlled emergency switch-off operation of switch 16 during an emergency event can be performed by shutdown unit 24 in such a way as to minimize the maximum junction temperature of switch 16 from reaching similar levels that the junction temperature reaches during some fast emergency switch-off operations.

Said differently, rather than perform a fast emergency switch-off during an emergency event to sink and/or discharge the current at the gate of switch 16 as quickly as possible (e.g., in a shortest amount of time possible), shutdown unit 24 of driver 20 may perform a controlled emergency switch-off of switch 16 by discharging the current at the gate of switch 16 in two stages or phases. By discharging the current at the gate of switch 16 in two stages or phases, shutdown unit 24 may prevent switch 16 from transitioning to clamping operation (if and when power circuit 4B includes a clamp such as clamp 22) and/or prevent the junction temperature of switch 16 from rising during an emergency switch-off operation as high as the junction temperature would otherwise rise during a fast emergency switch-off operation.

The techniques and circuits of shutdown unit 24 and a controlled emergency shutdown are described below in greater detail with respect to the additional figures. If switch 16 is protected by clamp 22, shutdown unit 24 of driver 20 may prevent clamp 22 from being driven into clamping operation, and as such, may prevent an associated rise in the junction temperature of switch 16. In addition, since shutdown unit 24 may perform controlled emergency switch-off operations, power circuit 4B does not need clamp 22 to protect switch 16 from thermal destruction caused by inductive energy dissipation during both emergency and non-emergency events.

Shutdown unit 24 may control the discharge of the gate of switch 16 to minimize the maximum junction temperature $T_j$ of switch 16 during a controlled emergency switch-off according to control equations 1 and 2 shown below in table 1.

TABLE 1

| | | |
|---|---|---|
| Eq. 1 | minimize the maximum junction temperature $T_j$ | $J_{Tj}$ = max(Tj) |

TABLE 1-continued

| | | |
|---|---|---|
| Eq. 2 | subject to the non-linear differential equation representing the electro-thermal system including the control constraints for the gate charge | $\frac{d}{dt}x = f(x(t), u(t)), x(0) = x_0$ <br><br> $u(t) \in [u_{min}, u_{max}]$ |

In accordance with the above control equations, shutdown unit 24 may divide the discharge of the gate charge of switch 16 during a controlled emergency switch-off into two phases. During the first phase of the controlled emergency switch-off, shutdown unit 24 may cause the gate charge of switch 16 to be discharged as fast as possible and for enough time that allows the demagnetization energy associated with switch 16 an opportunity to dissipate. However, in the second phase of the controlled emergency switch-off, rather than continue to discharge the gate of switch 16 as fast as possible to complete the controlled emergency switch-off of switch 16, shutdown unit 24 may cause the remaining gate charge of switch 16 to discharge at a slower rate. The slower rate may cause the drain current $I_D$ of switch 16 to be reduced during a controlled emergency switch-off as compared to a fast emergency switch-off performed by some other power circuit. A reduced $I_D$ of switch 16 may result in a lower $V_{DS}$ of switch 16 and further result in lower maximum power dissipations at switch 16. Consequently, shutdown unit 24 and the controlled emergency switch-off of switch 16 may cause the maximum junction temperature of switch 16 to be reduced.

Figure 5:
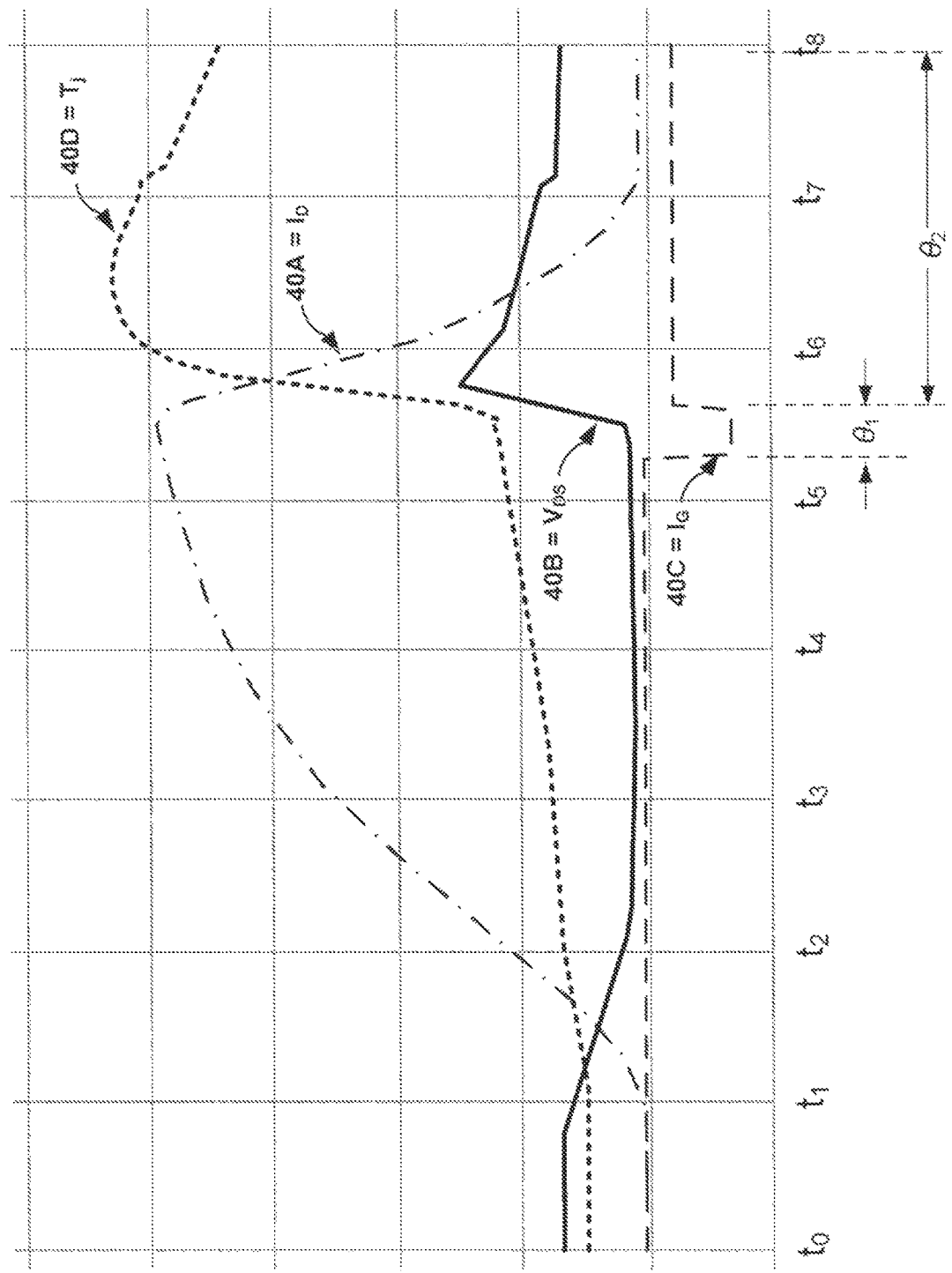
FIG. 5 is a timing diagram illustrating various timing characteristics of the power circuit shown in FIG. 4, in accordance with one or more aspects of the present disclosure.

FIG. 5 is a timing diagram illustrating various timing characteristics of power circuit 4B shown in FIG. 4, in accordance with one or more aspects of the present disclosure. Plots 40A-40D of FIG. 5 illustrate voltage, current, and temperature levels of portions of switch 16 as illustrated in FIG. 4 during an emergency event (e.g., a short of load 6) between times t0 and t8. Plot 40A shows the current level ("$I_D$") at the drain of switch 16 during the emergency event and plot 40B shows the voltage level ("$V_{DS}$") between the drain and source of switch 16 during the emergency event. Plot 40C shows the current level ("$I_G$") at the gate of switch 16 during the emergency event and plot 40D shows the junction temperature ("$T_j$") of switch 16 during the emergency event.

Emergency events may occur at various times during normal operation of power circuit 4B as controller unit 18 provides drive signal commands to driver 20 to control switch 16. These emergency events can cause large accumulations of inductive energy within power circuit 4B that, when dissipated, can lead to catastrophic thermal damage to the components of power circuit 4B.

Shutdown unit 24 of driver 20 may rely on $I_D$ of switch 16 and/or $V_{DS}$ of switch 16 to determine, independent of any driver control signal received by driver 20 from controller unit 18, whether or not to perform an emergency switch-off of switch 16. Based on $I_D$ of switch 16 and/or $V_{DS}$ of switch 16, shutdown unit 24 may determine that an emergency event is occurring or is about to occur at switch 16. Shutdown unit 24 may perform a controlled emergency switch-off by causing $I_G$ of switch 16 to discharge in a way that minimizes $T_j$ of switch 16 during the switch-off operation.

For example, FIG. 5 shows that an emergency event may begin at time t0 and last through time t8. At some point after t0, shutdown unit 24 may determine that an emergency event is occurring at power circuit 4B (e.g., based on $I_D$ and/or $V_{DS}$ of switch 16 shown in plots 40A and 40B). Rather than execute a fast emergency switch-off of switch 16 to discharge the current from link 14 as quickly as possible, shutdown unit 24 may initiate a controlled emergency switch-off of switch 16 in response to the emergency event by causing $I_G$ of switch 16 to discharge in a way that minimizes $T_J$ of switch 16.

Shutdown unit 24 may cause the discharge of $I_G$ of switch 16 during a controlled emergency switch-off to occur in two stages or phases. Between times t5 and t6, plot 40C illustrates that in phase 1 ("$\theta_f$") of the controlled emergency switch-off, shutdown unit 24 performs a "fast" discharge of $I_G$ of switch 16 and in phase 2 ("$\theta_2$") of the controlled emergency switch-off, shutdown unit 24 performs a "slow" discharge of $I_G$ of switch 16 (e.g., a magnitude of a slow discharge rate of phase 2 being greater than zero but less than a magnitude of a fast discharge rate of phase 1).

In some examples, shutdown unit 24 causes the transition from phase 1 of the controlled emergency switch-off (e.g., the fast discharge of $I_G$ of switch 16) to phase 2 of the controlled emergency switch-off (e.g., the slow discharge of $I_G$ of switch 16) to occur after a predefined time threshold. In other examples, shutdown unit 24 may cause the transition from phase 1 to phase 2 of the controlled emergency switch-off to occur according to a predefined current trip level hysteresis of $I_G$ of switch 16. In other words, after shutdown unit 24 determines some portion (e.g., 80%) of $I_D$ of switch 16 has occurred, shutdown unit 24 may cause the discharge of $I_G$ of switch 16 to transition from fast discharge to slow discharge. In still other examples, shutdown unit 24 may compare $V_{DS}$ of switch 16 to a maximum voltage threshold and may cause the discharge of $I_G$ of switch 16 during a controlled emergency switch-off to transition from phase 1 to phase 2 if $V_{DS}$ exceeds the maximum voltage threshold.

In any event, just like a fast emergency switch-off of switch 16, a controlled emergency switch-off of switch 16 can quickly stop further inductive energy from accumulating in power circuit 4B. As evidence that the controlled emergency switch-off of switch 16 can quickly stop further inductive energy from accumulating in power circuit 4B, plot 40A of FIG. 5 shows a sharp reduction to $I_D$ of switch 16 after time t5. However, plot 40B shows that as $I_D$ of switch 16 begins to drop after time t5, $V_{DS}$ of switch 16 gradually falls such that sharp, negative decrease to $V_L$ of load 6 and/or a sharp negative decrease to $I_L$ of load 6 are prevented. In contrast to a fast rate of change of $I_D$ and $V_{DS}$ of switch 16 that occurs during a fast emergency switch-off, a moderate rate of change of $I_D$ and $V_{DS}$ of switch 16 that occurs during a controlled emergency switch-off prevents switch 16 from being driven into clamping operation.

Plot 40D shows that after time t6, during the controlled emergency switch-off, because switch 16 is prevented from transitioning into clamping operation and/or the rate of change of $I_D$ and $V_{DS}$ of switch 16 is controlled, $T_J$ of switch 16 shows a reduced maximum temperature. In some examples, when compared to $T_J$ of switch 16 during a fast emergency switch-off (as shown by plot 30D of FIG. 3), $T_J$ of switch 16 during a controlled emergency switch-off may be reduced by approximately 6.4% or 24° C. Furthermore the reduced change to $I_L$ may relax a voltage drop on supply impedance and may help to stabilize a supply line during an emergency shutdown.

Figure 6:
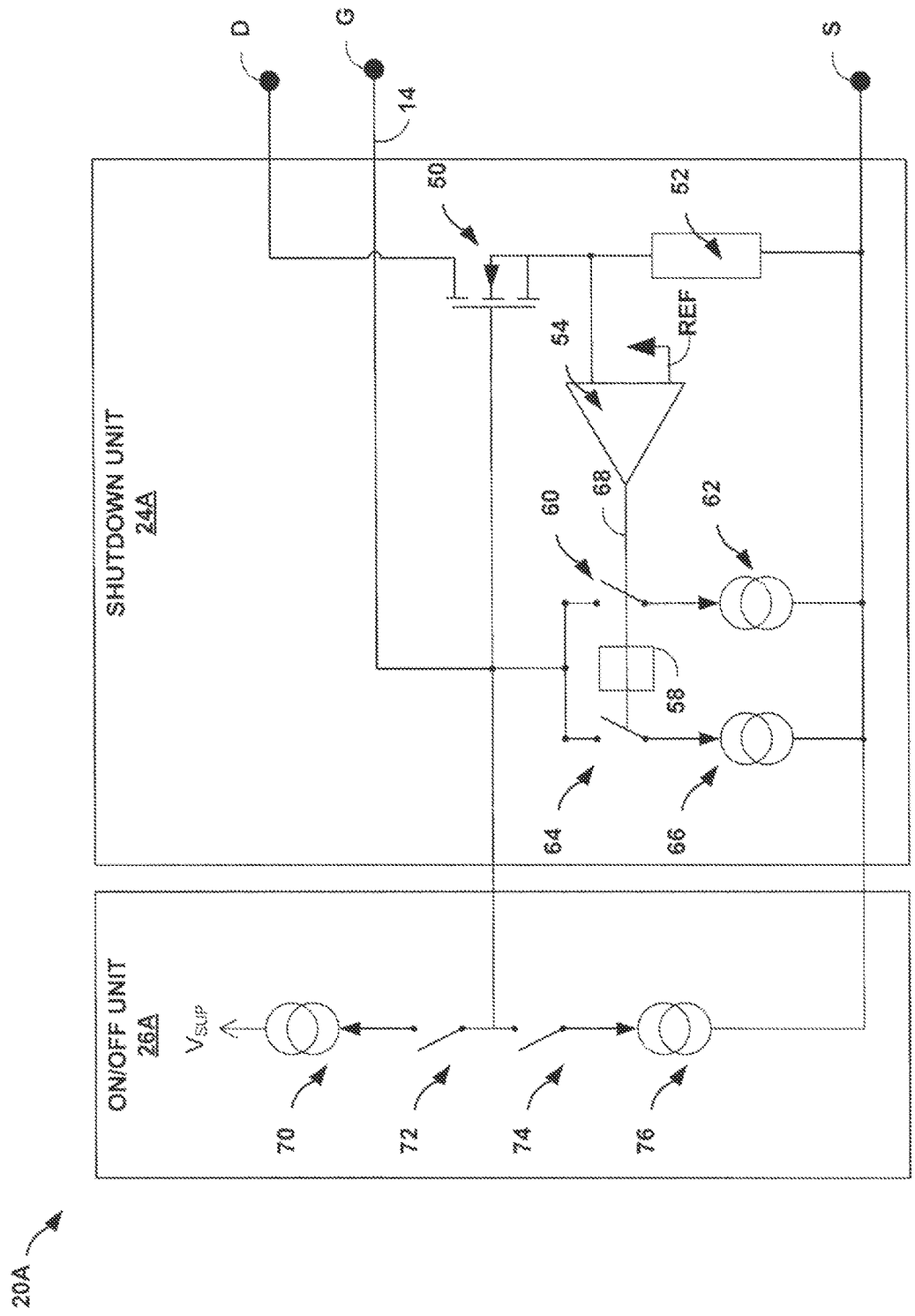
FIGS. 6 and 7 are block diagrams each illustrating an example driver of the power circuit shown in FIG. 4, in accordance with one or more aspects of the present disclosure.
Figure 7:
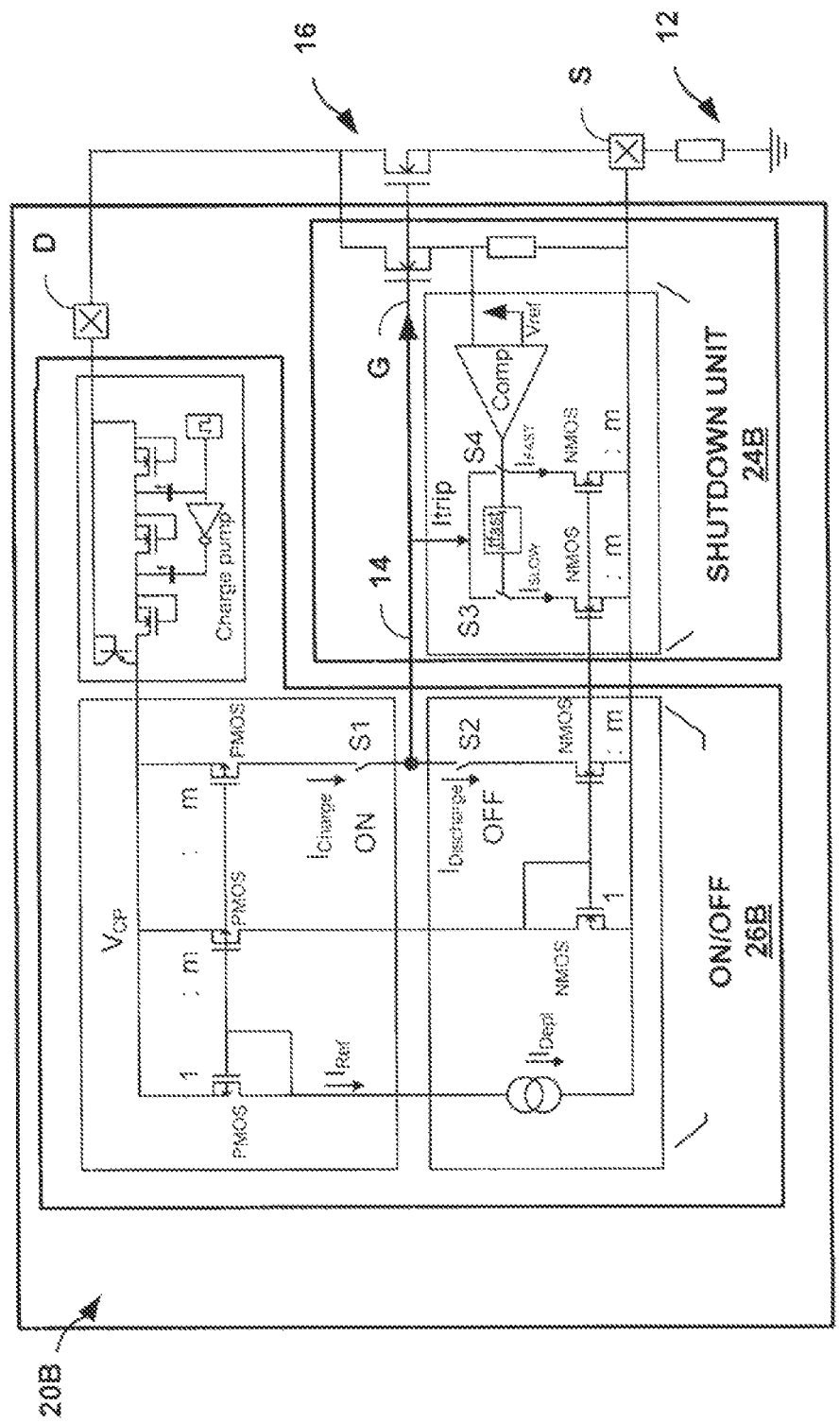

FIGS. 6 and 7 are block diagrams each illustrating examples of driver 20 of power circuit 4B shown in FIG. 4, in accordance with one or more aspects of the present disclosure. FIGS. 6 and 7 are described below within the context of power circuit 4B of FIG. 4.

As shown in FIG. 6, driver 20A may be coupled to each of a drain, a gate, and a source of a power switch, such as switch 16. Driver 20A of FIG. 6 includes ON/OFF unit 26A coupled to shutdown unit 24A via link 14. ON/OFF unit 26A and shutdown unit 24A are functionally equivalent, respectively, to ON/OFF unit 26 and shutdown unit 24 shown in FIG. 4.

ON/OFF unit 26A includes current mirrors 70 and 76 coupled to link 14 by switches 72 and 74, respectively. Shutdown unit 24A includes a sense unit made up of sense MOSFET 50 and shunt resistor 52. Shutdown unit 24A also includes comparator 54, buffer 58, current mirrors 62 and 66, switches 60 and 64, and link 68. Current mirrors 62 and 66 may represent different stages of shutdown unit 24A. For instance, a first stage of shutdown unit 24A may include current mirror 62 and/or additional current mirrors, operational amplifiers, and the like to perform a fast discharge of gate current at a power switch, such as switch 16. A second stage of shutdown unit 24A may include current mirror 66 and/or additional current mirrors, operational amplifiers, and the like to perform a slow discharge of gate current at a power switch, such as switch 16. Shutdown unit 24A may be operatively coupled to the gate of switch 16 and link 14 of power circuit 4B as well as each of the drain and the source of switch 16. In some examples, shutdown unit 24A may include additional or fewer components than those shown in FIG. 6.

FIG. 6 shows that ON/OFF unit 26A may provide current to the gate of switch 16 when switch 74 is open and switch 72 is closed. ON/OFF unit 26A may discharge current from the gate of switch 16 when switch 72 is open and switch 74 is closed. Driver 20A may include control logic (not shown) that controls the operation of switches 72 and 74. Current mirror 70 is coupled to a supply source ("$V_{SUP}$") which provides a source of the charge provided by ON/OFF unit 26A when driving switch 16 switched-on. Current mirror 76 is coupled to the source of switch 16 which provides a sink of the charge discharged by ON/OFF unit 26A from the grate of switch 16 when driving switch 16 switched-off. During normal operation (e.g., when an emergency event is not detected by driver 20A) ON/OFF unit 26A of driver 20A may provide $I_G$ of switch 16 at link 14 to drive switch 16 on and may discharge $I_G$ of switch 16 from link 14 to drive switch 16 off.

In the example of FIG. 6, where ON/OFF unit 26A may charge or discharge the gate of switch 16 during normal switching operations of switch 16, shutdown unit 24A of driver 20A may perform a controlled emergency switch-off of switch 16 when shutdown unit 24A detects an emergency event. The combination of sense MOSFET 50 and shunt resistor 52 of shutdown unit 24A represents a sense unit which provides load current ("$I_L$") sensing capability to shutdown unit 24A. FIG. 6 shows the terminals drain, gate source of sense MOSFET 50 being coupled to the terminals of switch 16 to synchronize the operational state of switch 16 and sense MOSFET 50. In other words, by coupling the terminals of switch 16 and sense MOSFET 50, switch 16 and sense MOSFET 50 can simultaneously operate in either the same "switched-on" or "switched-off" states. When switch 16 and sense MOSFET 50 are each operating in a switched-on state, shutdown unit 24A can determine the amount of current ("$I_L$") at load 6 (e.g., the amount of current flowing out of switch 16) by determining a ratio between the voltage level across shunt resistor 52 and the resistance of shunt resistor 52. Shutdown unit 24A may determine whether or not an emergency event is occurring at load 6 or in some other portion of power circuit 4B based on a current level at a sense unit (e.g., the determined $I_L$ at load 6). If shutdown unit 24A determines that an emergency event is or is about to occur at power circuit 4B, shutdown unit 24A of driver 20A may initiate a controlled switch-off of switch 16.

For example, shutdown unit 24A of FIG. 6 may rely on the output from comparator 54 at link 68 to determine when to initiate a controlled emergency switch-off of switch 16. FIG. 6 shows that a first input to comparator 54 corresponds to the voltage across shunt resistor 52 and a second input to comparator 54 corresponds to a threshold voltage (e.g., a maximum voltage across shunt resistor 52 that indicates an emergency event is occurring or is about to occur). In some examples, the first input at comparator 54 may correspond to IL at load 6 (e.g., a ratio between the voltage across shunt resistor 52 and the resistance of shunt resistor 52) and the second input at comparator 54 may correspond to a threshold current (e.g., a maximum current through shunt resistor 52 that indicates an emergency event may be occurring or about to occur).

Comparator 54 shown in FIG. 6 may output a first value at link 68 if the first input exceeds the second input, and may output a second value at link 68 if the first input does not exceed the second input. Shutdown unit 24A determines when to initiate a controlled emergency switch-off of switch 16 based on the output from comparator 54. For instance, in some examples, shutdown unit 24A may initiate a controlled emergency switch-off of switch 16 when the output of comparator 54 indicates that the voltage across shunt resistor 52 exceeds a threshold amount of voltage that is equivalent to a current trip level of shutdown unit 24A (e.g., 80% of the maximum current that switch 16 can safely handle).

Unlike a normal switch-off operation in which ON/OFF unit 26A may discharge the gate charge to switch 16 on behalf of driver 20A, during an emergency event, shutdown unit 24A shown in FIG. 6 may take over the discharge of gate charge from link 14 for driver 20A by performing a controlled emergency switch-off operation having two phases. Shutdown unit 24A may perform phase 1 of the controlled emergency switch-off by enabling the first stage of shutdown unit 24A for discharging the gate charge of switch 16 using current mirror 62 and/or additional current mirrors, operational amplifiers, and the like to perform a "fast discharge." Shutdown unit 24A may perform phase 2 of the controlled emergency switch-off by enabling the second stage of shutdown unit 24A for discharging the gate charge of switch 16 using current mirror 66 and/or additional current mirrors, operational amplifiers, and the like to perform a "slow discharge."

For example, in the example of FIG. 6, at the start of a controlled emergency switch-off, shutdown unit 24A or some other driver control logic of driver 20A may cause ON/OFF unit 26A to open both switches 72 and 74 to ensure no current is being provided or discharge by ON/OFF unit 26A. Next, shutdown unit 24A may close switch 60 to begin phase 1 of the controlled emergency switch-off of switch 16 (e.g., like a "fast emergency switch-off" to quickly remove as much charge from the gate of switch 16) to cause a fast demagnetization of load 6. After performing phase 1 of the controlled emergency switch-off operation, shutdown unit 24A may transition to phase 2 of the controlled emergency switch-off by opening switch 60 and closing switch 64 to cause a slow demagnetization of load 6.

The transition by shutdown unit 24A of FIG. 6 from phase 1 to phase 2 of the controlled emergency switch-off operation may be triggered in various ways. In some examples, shutdown unit 24A may transition to phase 2 of the controlled emergency switch-off after a predefined time ($t_{FAST}$) as shown by buffer 58 between switches 60 and 64. In some examples, shutdown unit 24A may transition from phase 1 to phase 2 of the controlled emergency switch-off operation according to a predefined current trip level hysteresis (e.g., when $I_L$ as measured with sense MOSFET 50 and shunt resistor 52 reaches 80% of the current trip associated with switch 16). In still other examples, shutdown unit 24A may transition from phase 1 to phase 2 of the controlled emergency switch-off operation if shutdown unit 24A or some other logic block of driver 20A determines that the voltage across switch 16 (e.g., $V_{DS}$) exceeds a maximum voltage threshold. In any event, after shutdown unit 24A determines that the transition to phase 2 of the controlled emergency switch-off operation is to occur, driver 20A may open switch 60 and immediately close switch 64 to continue discharging the gate charge of switch 16 at link 14 using current mirror 66 to perform a slow discharge and to prevent a junction temperature rise at switch 16.

In this way, shutdown unit 24A of FIG. 6 may prevent switch 16 from being driven into an active overvoltage clamp. Consequently, clamp 22 can be omitted when driver 20A includes shutdown unit 24A and may reduce the physical size (e.g., area) of power circuit 4B and/or cost.

Driver 20B of FIG. 7 includes additional details of driver 20 from FIG. 4 beyond that shown by driver 20A of FIG. 6. For example, driver 20B of FIG. 7 may be an integrated component of a switch device being used as in a power circuit (e.g., a half-bridge circuit) as a high side switch. As shown in FIG. 7, driver 20B includes ON/OFF unit 26B coupled to shutdown unit 24B via link 14, with shutdown unit 24B being coupled to the gate and the source of switch 16. ON/OFF unit 26B and shutdown unit 24B are functionally equivalent, respectively, to ON/OFF unit 26 and shutdown unit 24 shown in FIG. 4.

As shown in FIG. 7, ON/OFF unit 26B of driver 20B includes a charge pump circuit that may supply power to ON/OFF unit 26B until a certain $V_{DS}$ via bipolar and otherwise at low $V_{DS}$ pump the gate voltage to a higher value than the supply.

FIG. 7 further shows that within ON/OFF unit 26B, PMOS current mirrors deliver the charging currents and NMOS current mirrors provide the discharge currents. Like driver 20A of FIG. 6, the load current being measured downstream (e.g., at load 6) by driver 20B of FIG. 7 is being measured via a sense MOSFET and a shunt resistor of shutdown unit 24B. Also similar to driver 20A of FIG. 6, the comparator of shutdown unit 24B shown in FIG. 7 may initiate the controlled emergency switch-off operation when the voltage drop over the shunt resistor associated with the sense MOSFET exceeds a voltage threshold or limit which is defined by $V_{REF}$. In order of operations for performing a controlled emergency switch-off, after opening both switches S1 and S2 of ON/OFF unit 26B, driver 20B may close switch S4 of shutdown unit 24B to discharge the gate charge using the current mirror of shutdown unit 24B labeled IFAST (e.g., to minimize the switch off time and to start with the fast demagnetization of load 6). After a defined time ($t_{FAST}$) or after reaching a $V_{DS}$ limit, driver 20B may transition to phase 2 and open switch S4 of shutdown unit 24B and immediately close switch S3 of shutdown unit 24B to continue discharging with the current mirror labeled ISLOW (e.g., to control the current and voltage slew rate of the load path).

Figure 8:
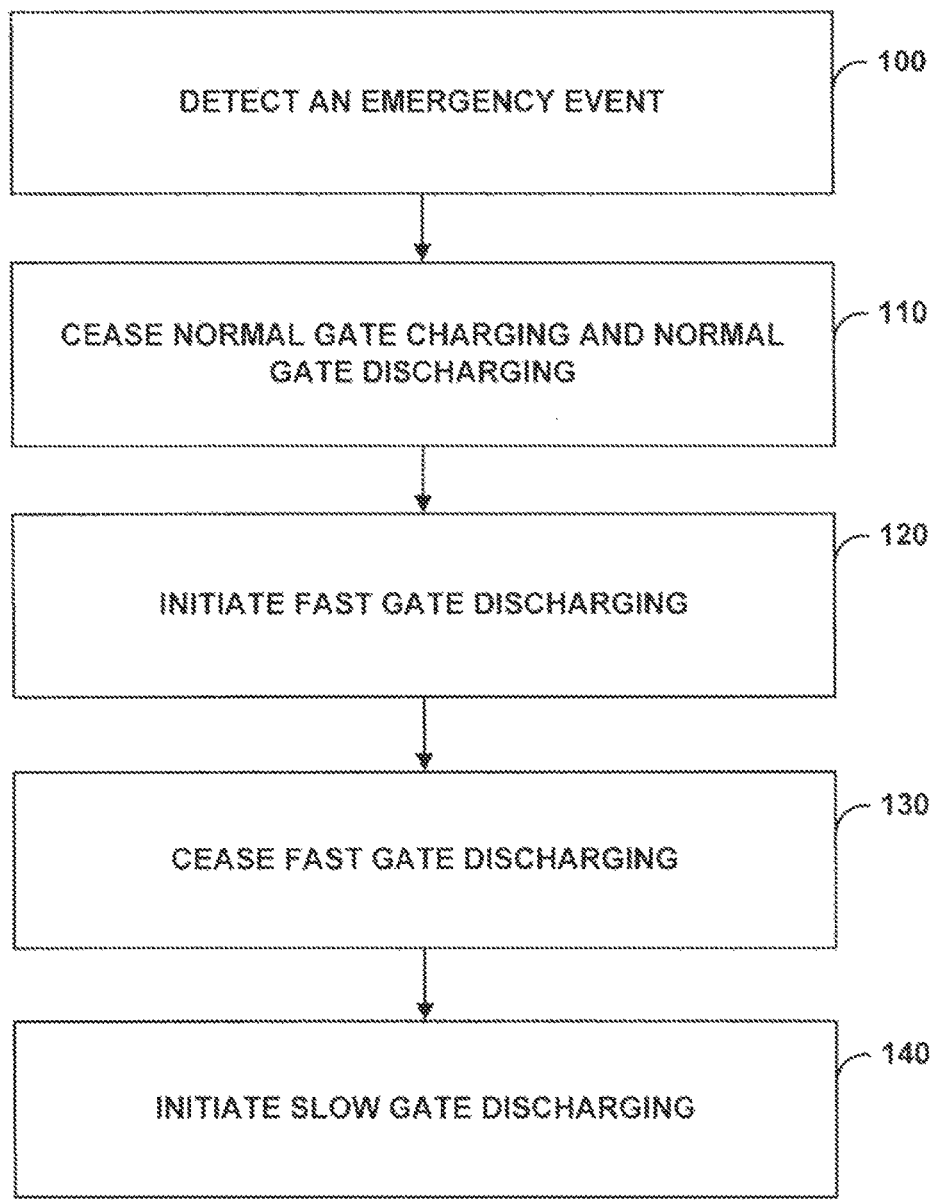
FIG. 8 is a flow chart illustrating example operations of an example driver, in accordance with one or more aspects of the present disclosure.

FIG. 8 is a flow chart illustrating example operations of driver 20 of power circuit 4B, in accordance with one or more aspects of the present disclosure. FIG. 8 is described below within the context of driver 20 and power circuit 4B of FIG. 4.

FIG. 8 shows that driver 20 of power circuit 4B may detect an emergency event (100). For example, shutdown unit 24 of driver 20 may determine that $V_{DS}$ of switch 16 and/or $I_L$ of load 6 exceeds a voltage and/or current threshold, respectively, and may determine that an emergency event (e.g., an overload) is occurring or is about to occur.

In the example of FIG. 8, driver 20 may cease normal gate charging and normal gate discharging of switch 16 after detecting that the emergency event is occurring or is about to occur (110). For example, ON/OFF unit 26 of driver 20 may cease providing a charge or discharge current to link 14, or in other words, stops driving switch 16 to a normal switch-off or switch-on state.

FIG. 8 shows that after ON/OFF unit 26 ceases driving the gate of switch 16, shutdown unit 24 may initiate fast gate discharging of the gate of switch 16 (120). For example, shutdown unit 24 may begin phase 1 a controlled emergency switch-off operation and cause the gate charge of switch 16 to discharge quickly (e.g., at −1 mA).

In the example of FIG. 8, driver 20 may cease fast gate discharging when shutdown unit 24 determines that driver 20 should transition to phase 2 of the controlled emergency switch-off operation. For example, shutdown unit 24 may transition to phase 2 of the controlled emergency switch-off after a predefined time (e.g., 4 us), according to a predefined current trip level hysteresis (e.g., when $I_L$ as measured with sense MOSFET 50 and shunt resistor 52 reaches 80% of the current trip associated with switch 16), and/or if the voltage across switch 16 (e.g., $V_{DS}$) exceeds a maximum voltage threshold.

FIG. 8 shows that driver 20 may complete the controlled emergency switch-off operation of switch 16 by initiating a slow gate discharging of switch 16 (140). For instance, after shutdown unit 24 determines that the transition to phase 2 of the controlled emergency switch-off operation is to occur, driver 20 may perform a slow discharge of the gate of switch 16 and cause the gate of switch 16 to discharge slower than during phase 1 (e.g., at −20 uA) to prevent a high junction temperature rise at switch 16. In this way, by performing a controlled emergency switch-off operation according to the steps of FIG. 8, a power circuit, such as power circuit 4B, may avoid driving a power switch based switch device into clamping operation and may eliminate the need to rely on a Zener clamp.

FIG. 9 is a timing diagram illustrating various timing characteristics of the example drivers shown in FIGS. 6 and 7, in accordance with one or more aspects of the present disclosure. FIG. 9 shows the gate charge at switch 16 as shutdown unit 24 performs a controlled emergency switch-off operation of the charge at link 14. For example, FIG. 9 shows phase 1 of the controlled emergency switch-off operation as causing a fast gate discharge (e.g., a −1 mA gate charge being discharged from the gate of switch 16) for approximately 4 us. FIG. 9 further illustrates that after 4 us, shutdown unit 24 transitions to phase 2 of the controlled emergency switch-off operation during which a slow gate discharge occurs for the remainder of the emergency event (e.g., a −20 uA gate charge being discharged from the gate of switch 16). Through this controlled emergency switch-off operation, driver 20, using shutdown unit 24, may ensure the junction temperature of switch 16 remains within the operation temperature limits of switch 16 and further may eliminate the need for a Zener clamp across the drain and gate of switch 16.

Figures 10A, 10B:
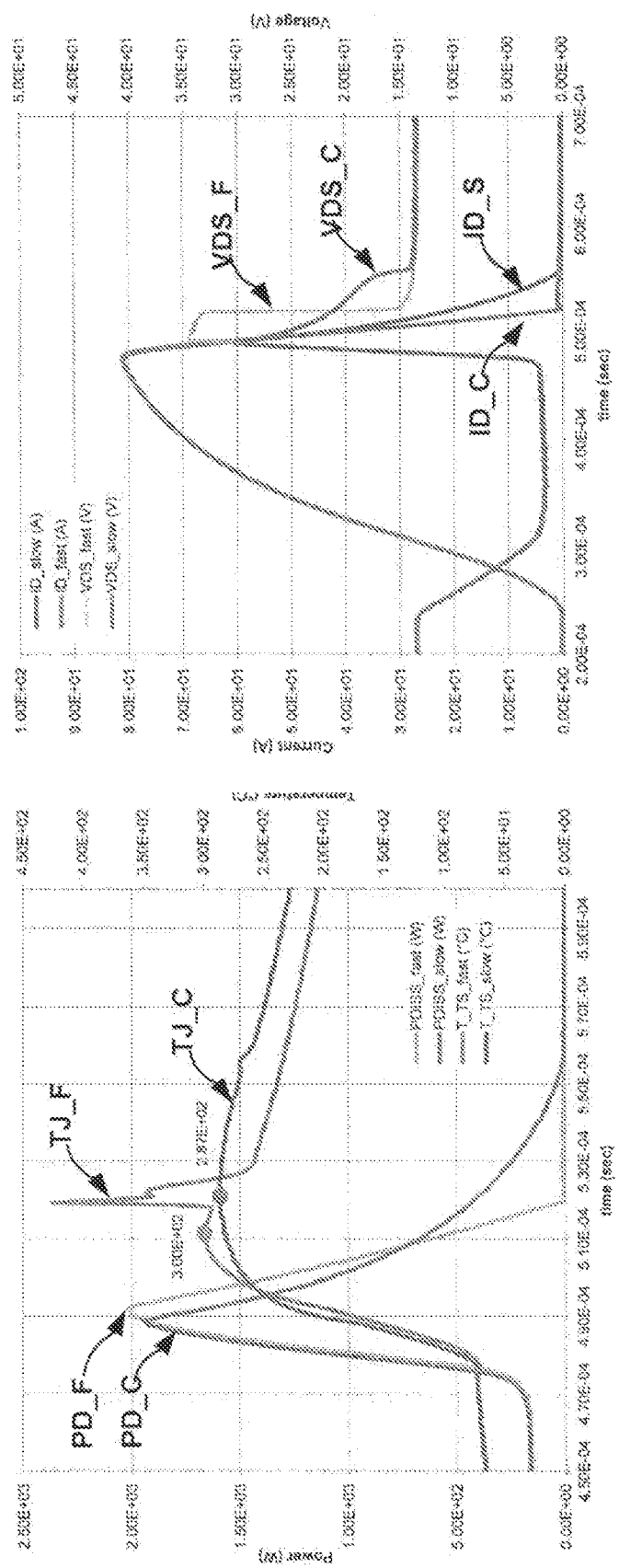
FIGS. 10A and 10B are timing diagrams illustrating various timing characteristics of the power circuit shown in FIG. 4, in accordance with one or more aspects of the present disclosure.

FIGS. 10A and 10B are timing diagrams illustrating various timing characteristics of power circuit 4B shown in FIG. 4, in accordance with one or more aspects of the present disclosure. FIGS. 10A and 10B. show comparisons of electrical and thermal characteristics of switch 16 when either a fast emergency switch-off occurs during an emergency event or when a controlled emergency switch-off occurs during an emergency event, in accordance with the described circuits and techniques.

FIG. 10A shows plots of the junction temperature (TJ_C) and power dissipation (PD_C) of switch 16 over time during a controlled emergency switch-off operation alongside plots of the junction temperature (TJ_F) and power dissipation (PD_F) of switch 16 over time during a fast emergency switch-off operation. The peak junction temperature and the peak power dissipation of switch 16 during a controlled emergency switch-off operation are less than the peak junction temperature and the peak power dissipation of switch 16 during a fast emergency switch-off operation.

FIG. 10B shows plots of $V_{DS}$ (VDS_C) and $I_D$ (ID_C) of switch 16 over time during a controlled emergency switch-off operation alongside plots of $V_{DS}$ (VDS_F) and $I_D$ (ID_F) of switch 16 over time during a fast emergency switch-off operation. The peak $V_{DS}$ and the peak $I_D$ of switch 16 during a controlled emergency switch-off operation are less than the peak $V_{DS}$ and the peak $I_D$ of switch 16 during a fast emergency switch-off operation.

Figure 11:
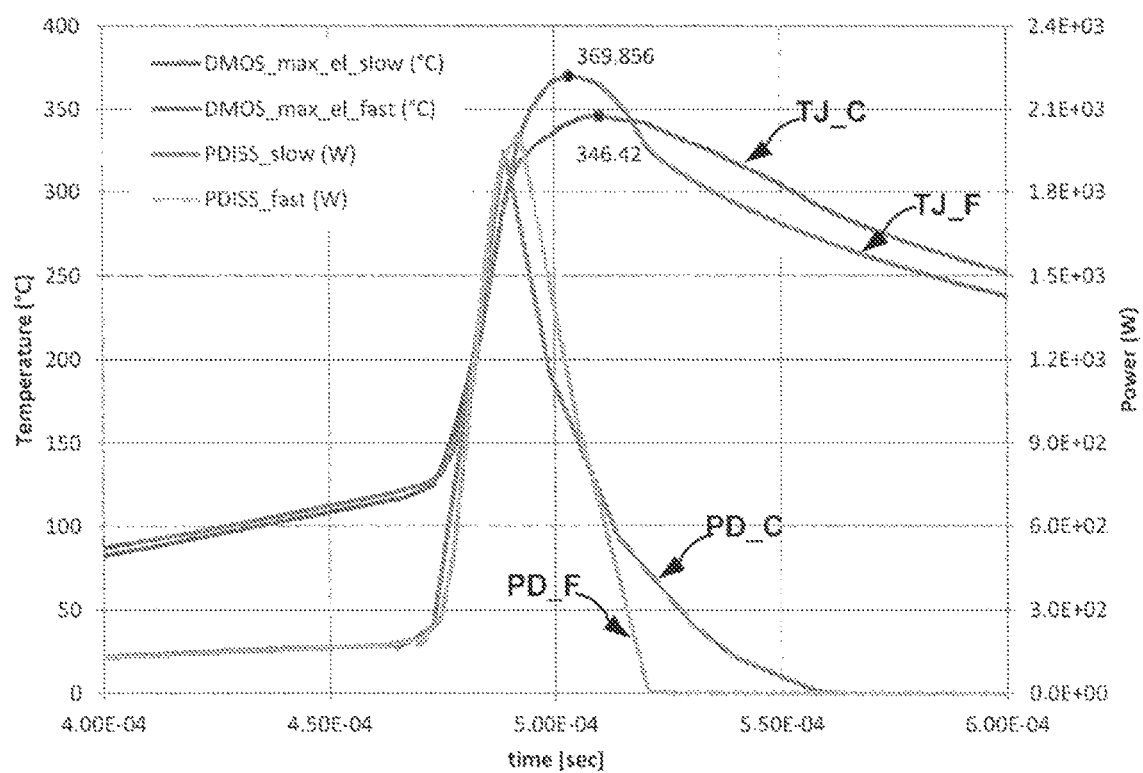
FIG. 11 is a timing diagram illustrating various timing characteristics of the power circuit shown in FIG. 4, in accordance with one or more aspects of the present disclosure.

FIG. 11 is a timing diagram illustrating various timing characteristics of power circuit 4B shown in FIG. 4, in accordance with one or more aspects of the present disclosure. FIG. 11 shows plots of the junction temperature (TJ_C) and power dissipation (PD_C) of switch 16 over time during a controlled emergency switch-off operation alongside plots of the junction temperature (TJ_F) and power dissipation (PD_F) of switch 16 over time during a fast emergency switch-off operation. FIG. 11 shows that in comparison to fast emergency switch-off, a controlled emergency switch-off may result in a significant reduction concerning the maximum junction temperature of switch 16. The maximum junction temperature shown in FIG. 11 decreases by 6.4% or 24° C.

In many applications, a power switch such as switch 16 is selected for a power circuit application not based on the switch's $R_{DSON}$ but by the required clamping energy of the switch. FIG. 11 shows that by performing controlled emergency switch-off operations instead of fast emergency switch-off operations, a power circuit may be able to use a cheaper power switch, that has a smaller area, and can withstand a lower maximum junction temperature.

Figures 12A, 12B:
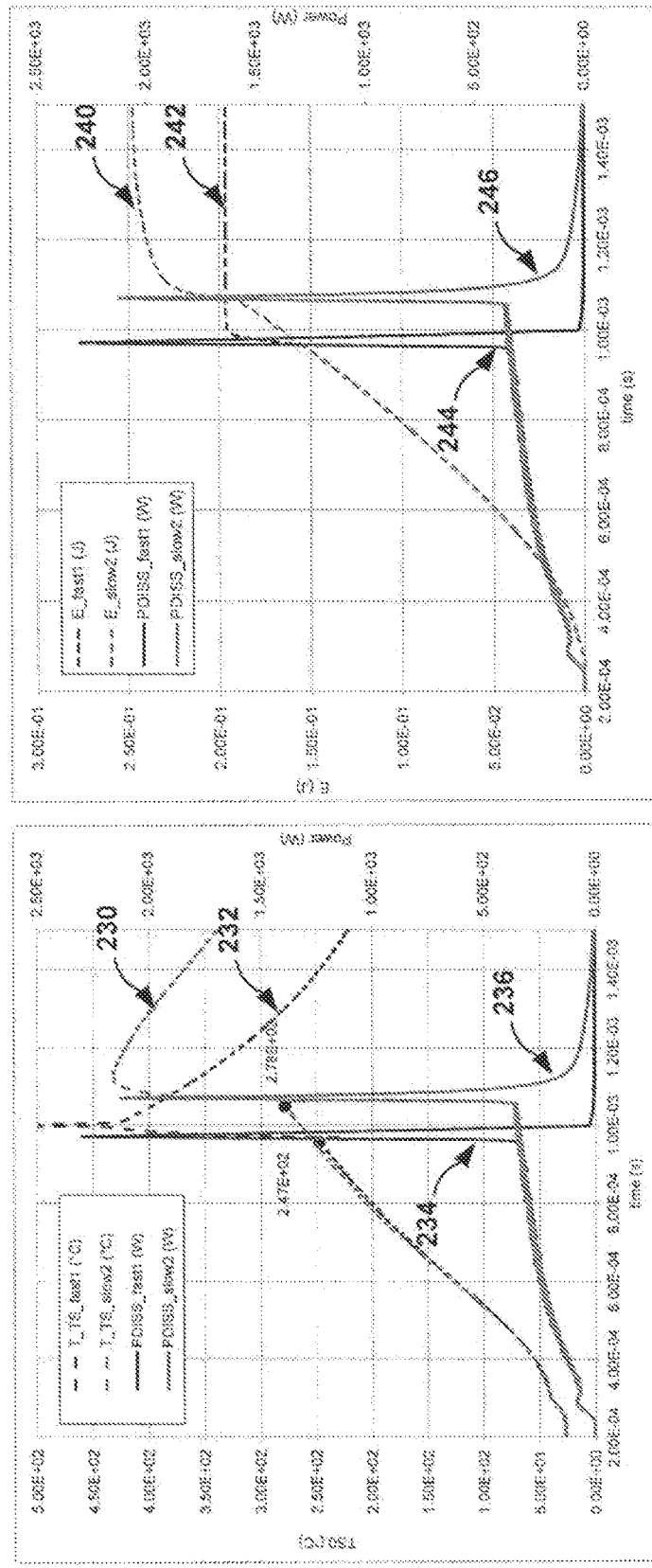
FIGS. 12A and 12B are timing diagrams illustrating various timing characteristics of the power circuit shown in FIG. 4, in accordance with one or more aspects of the present disclosure.

FIGS. 12A and 12B are timing diagrams illustrating various timing characteristics of power circuit 4B shown in FIG. 4, in accordance with one or more aspects of the present disclosure. The plots of FIGS. 12A and 12B each compare controlled emergency switch-off behavior to fast emergency switch-off behavior of switch 16 with the maximum power pulse width before switch 16 fails. Assuming a constant destruction temperature of switch 16, the shutdown temperature can be used to determine the difference in temperature rise of the controlled emergency switch-off behavior and fast emergency switch-off behavior. The controlled emergency switch-off leads to a significant higher pulse width and consequently a higher maximum shutdown temperature. Consequently the maximum junction temperature is decreased by 5.5% or 31° C. assuming a destruction temperature of 550° C.

Figure 13:
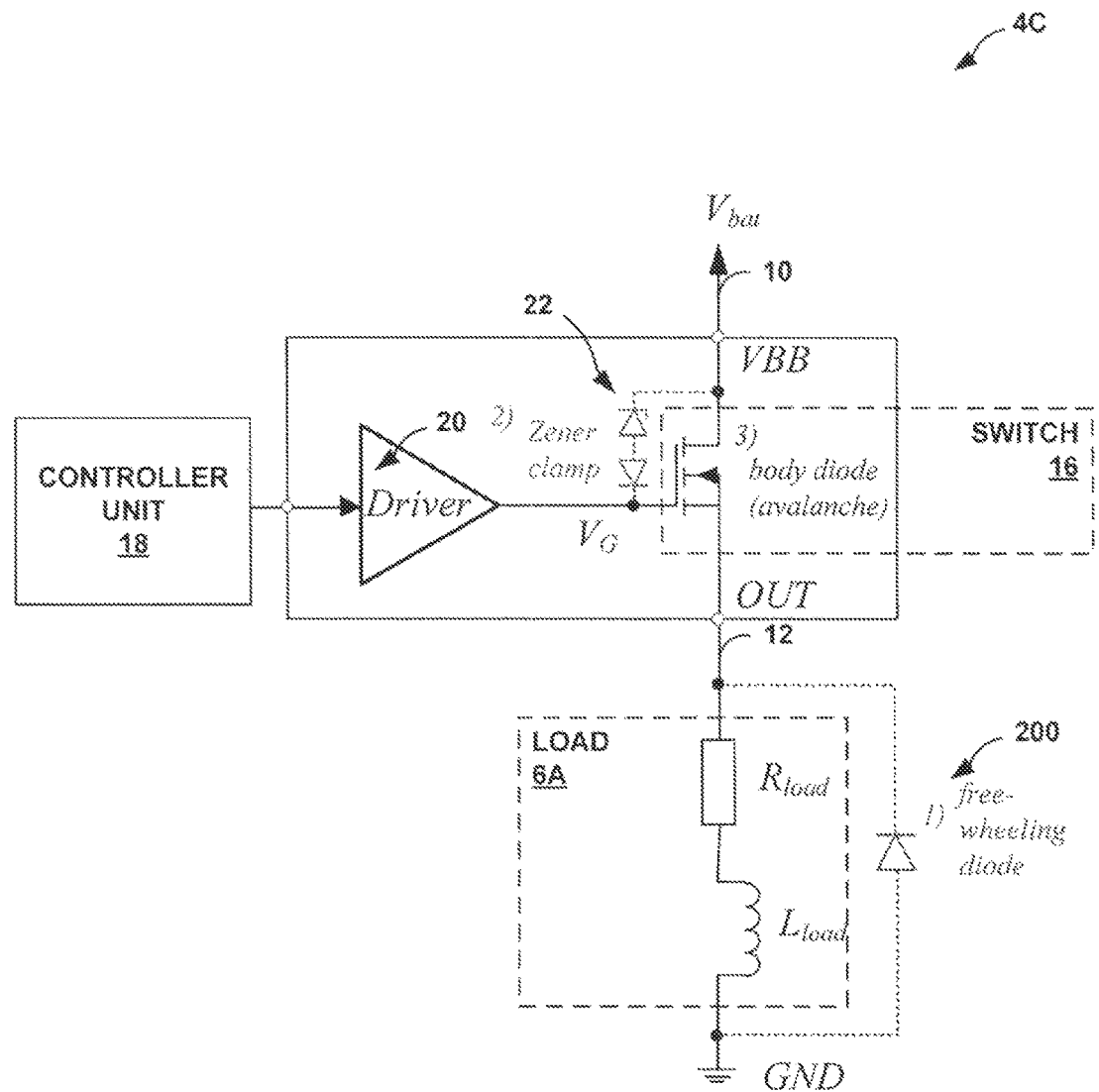
FIG. 13 is a block diagram illustrating an additional example of a power circuit of the example system shown in FIG. 1.

FIG. 13 is a block diagram illustrating an additional example of a power circuit of the example system shown in FIG. 1. FIG. 13 shows power circuit 4C including controller unit 18, driver 20, clamp 22, and switch 16. In the example of FIG. 13, link 10 is coupled to a battery source and the drain of switch 16. The output of power circuit 4C is coupled to link 12 and load 6A which is shown as an example of an inductive load. FIG. 13 further illustrates the body diode within switch 16 as well as an example of freewheeling diode 200 for protecting load 6A from potential shorts during emergency events.

Figure 14:
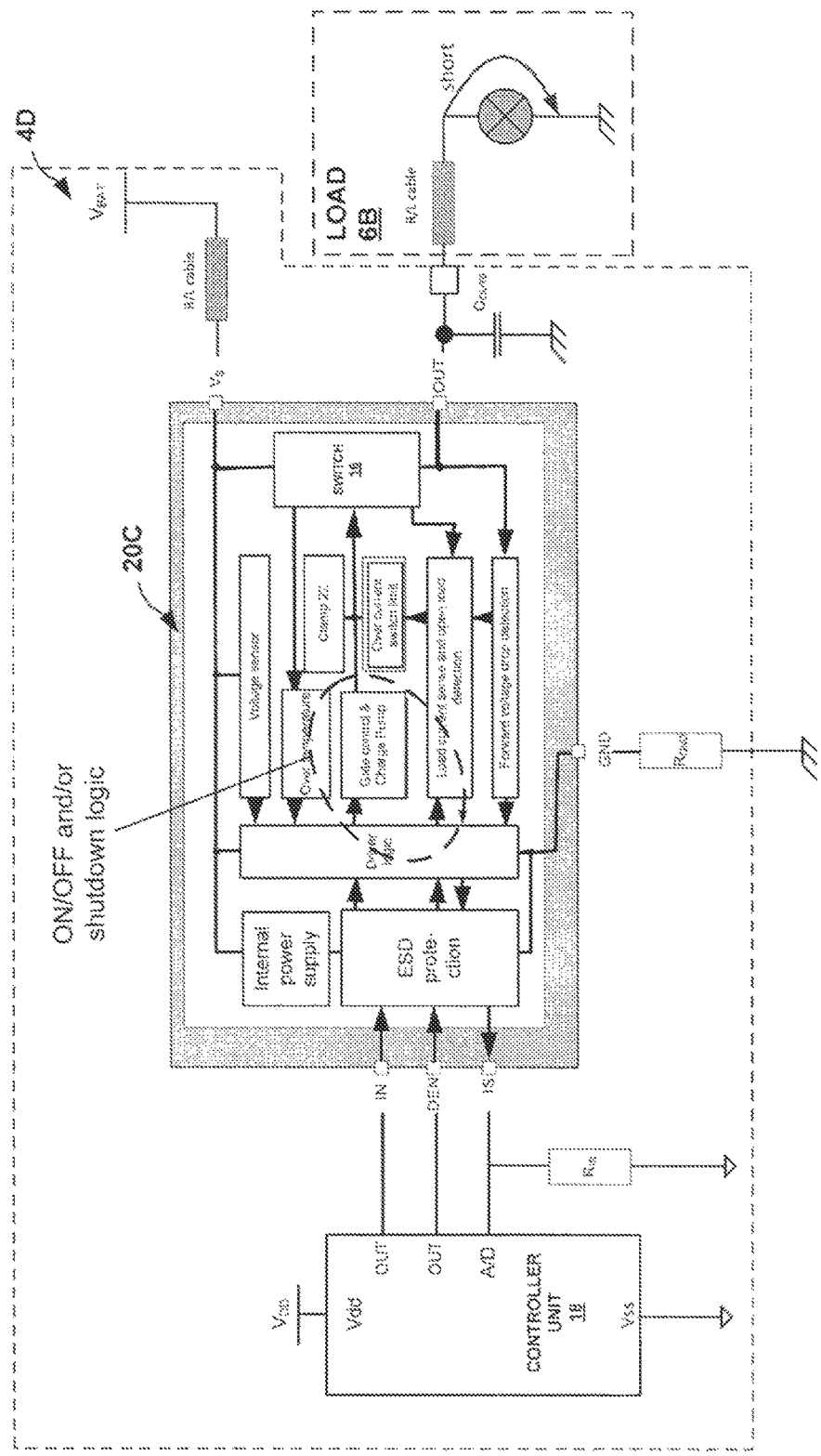
FIG. 14 is a block diagram illustrating an additional example of a power circuit of the example system shown in FIG. 1.

FIG. 14 is a block diagram illustrating an additional example of a power circuit of the example system shown in FIG. 1. FIG. 14 shows power circuit 4D including controller unit 18, driver 20C, and switch 16. In the example of FIG. 13, the output of power circuit 4D is coupled to link 12 and load 6B which is shown as an example of an inductive load being shorted causing the R/L cable of load 6B to act as the inductive load element of load 6B. FIG. 14 further illustrates that ON/OFF and/or shutdown logic for performing the techniques described above with respect to ON/OFF unit 26 and shutdown unit 24 of FIG. 4 may be included in driver 20C as part of a gate control and charge pump logic block.

Clause 1. A method comprising: detecting, by a driver, an emergency event within a power circuit that includes a switch for controlling current to a resistive-inductive-capacitive load; and performing, by the driver, a controlled emergency switch-off operation of the switch in response to a detected emergency event.

Clause 2. The method of clause 1, wherein performing the controlled emergency switch-off operation of the switch in response to a detected emergency event comprises: initiating, by the driver, a fast gate discharge of the switch; ceasing, by the driver, the fast gate discharge of the switch; and initiating, by the driver, a slow gate discharge of the switch after ceasing the fast gate discharge of the switch.

Clause 3. The method of clause 2, wherein the fast gate discharge of the switch is initiated at a first point time, wherein ceasing the fast gate discharge of the switch comprises: ceasing, by the driver, the fast gate discharge of the switch in response to determining that a predefined time has elapsed since the first point in time.

Clause 4. The method of clause 3, wherein the predefined time is selected based at least in part to minimize a maximum junction temperature of the switch during the controlled emergency switch-off operation.

Clause 5. The method of any of clauses 2-4, wherein ceasing the fast gate discharge of the switch comprises: detecting a current output of the switch; and ceasing the fast gate discharge of the switch in response to determining that the current output of the switch satisfies a current threshold.

Clause 6. The method of clause 5, wherein the current threshold is based on a current trip level hysteresis of the load current for minimizing a maximum junction temperature of the switch during the controlled emergency switching operation.

Clause 7. The method of any of clauses 2-6, wherein ceasing the fast gate discharge of the switch comprises: detecting a voltage level of the switch; and ceasing the fast gate discharge of the switch in response to determining that the voltage level of the switch satisfies a voltage threshold.

Clause 8. The method of any of clauses 1-7, further comprising: refraining from performing, by the driver, the controlled emergency switch-off operation of the switch during a non-emergency event within the power circuit.

Clause 9. The method of any of clauses 1-8, further comprising: driving, by the driver, the switch in an on-state of the switch prior to the detected emergency event.

Clause 10. The method of any of clauses 1-9, wherein the emergency event is detected while the switch is being driven in the on-state.

Clause 11. The method of any of clauses 1-10, further comprising: ceasing, by the driver, from driving or sinking a gate charge associated with the switch prior to performing the controlled emergency switch-off operation.

Clause 12. The method of any of clauses 1-11, wherein the switch comprises a semiconductor type power switch.

Clause 13. The method of any of clauses 1-12, wherein the circuit comprises a clamp, wherein performing the controlled emergency switch-off operation comprises limiting, by the driver, a voltage at the switch to prevent the clamp from driving the switch into clamping operation.

Clause 14. The method of any of clauses 1-3, wherein the driver comprises a shutdown unit for at least performing the controlled emergency switch-off operation of the switch in response to the detected emergency event Clause 15. A power circuit comprising: a switch coupled to a resistive-capacitive-inductive load; and a driver for controlling the switch, wherein the driver is configured to perform an controlled emergency switch-off of the switch in response to an emergency event detected within the power circuit.

Clause 16. The power circuit of clause 15, further comprising: a clamp, wherein the driver is further configured to limit a voltage at the switch to prevent the clamp from driving the switch into clamping operation.

Clause 17. The power circuit of any of clauses 15-16, wherein the driver further comprises: a first stage and a second stage, wherein the driver is configured to perform the controlled emergency switch-off of the switch by at least: enabling the first stage to perform a fast discharge of gate charge at the switch; and enabling the second stage to perform a slow discharge of gate charge at the switch after disabling the first current mirror.

Clause 18. The power circuit of clause 17, wherein: the first stage comprises at least one of a first current mirror or a first operational amplifier, and the second stage comprises at least one of a second current mirror or a second operational amplifier.

Clause 19. The power circuit of any of clauses 15-18, wherein the driver further comprises: a sense unit, wherein the driver is further configured to detect the emergency event based on a current level at the sense unit.

Clause 20. A power circuit comprising: a switch coupled to a resistive-capacitive-inductive load; and a driver coupled to the switch, wherein the driver comprises: means for detecting an emergency event within the power circuit; and means for performing a controlled emergency switch-off operation of the switch in response to the detected emergency event.

Clause 22. A power circuit comprising means for performing any of the methods of clauses 1-14.

Various examples have been described. These and other examples are within the scope of the following claims.

What is claimed is:

1. A method comprising:
   detecting, by a driver, an emergency event within a power circuit that includes: a switch for controlling current to a resistive-inductive-capacitive load and a clamp; and
   performing, by the driver, a controlled emergency switch-off operation of the switch in response to the emergency event by at least limiting a voltage at the switch to a value that prevents the clamp from driving the switch into clamping operation and that prevents a rise in junction temperature of the switch, wherein performing the controlled emergency switch-off operation of the switch in response to the emergency event comprises:
initiating a fast gate discharge of the switch;
detecting a current output of the switch;
ceasing the fast gate discharge of the switch in response to determining that the current output of the switch satisfies a current threshold; and
initiating a slow gate discharge of the switch after ceasing the fast gate discharge of the switch.

2. The method of claim 1, wherein the current threshold is based on a current trip level hysteresis of the load current for minimizing a maximum junction temperature of the switch during the controlled emergency switching operation.

3. The method of claim 1, further comprising:
refraining from performing, by the driver, the controlled emergency switch-off operation of the switch during a non-emergency event within the power circuit.

4. The method of claim 1, further comprising:
driving, by the driver, the switch in an on-state of the switch prior to the emergency event.

5. The method of claim 1, wherein the emergency event is detected while the switch is being driven in the on-state.

6. The method of claim 1, further comprising:
ceasing, by the driver, from driving or sinking a gate charge associated with the switch prior to performing the controlled emergency switch-off operation.

7. The method of claim 1, wherein the switch comprises a semiconductor type power switch.

8. The method of claim 1, wherein the driver comprises a shutdown unit for at least performing the controlled emergency switch-off operation of the switch in response to the emergency event.

9. A power circuit comprising:
a switch coupled to a resistive-capacitive-inductive load;
a clamp; and
a driver for controlling the switch, wherein the driver is configured to perform a controlled emergency switch-off of the switch in response to an emergency event detected within the power circuit by at least limiting a voltage at the switch to a value that prevents the clamp from driving the switch into clamping operation and that prevents a rise in junction temperature of the switch, wherein the driver is configured to perform the controlled emergency switch-off operation of the switch in response to the emergency event by at least:
initiating a fast gate discharge of the switch;
detecting a current output of the switch;
ceasing the fast gate discharge of the switch in response to determining that the current output of the switch satisfies a current threshold; and
initiating a slow gate discharge of the switch after ceasing the fast gate discharge of the switch.

10. The power circuit of claim 9, wherein the driver further comprises:
a first stage and a second stage, wherein the driver is configured to perform the controlled emergency switch-off of the switch by at least:
enabling the first stage to perform the fast discharge of gate charge at the switch; and
enabling the second stage to perform the slow discharge of gate charge at the switch after disabling the first stage.

11. The power circuit of claim 10, wherein:
the first stage comprises at least one of a first current mirror or a first operational amplifier, and
the second stage comprises at least one of a second current mirror or a second operational amplifier.

12. The power circuit of claim 9, wherein the driver further comprises:
a sense unit, wherein the driver is further configured to detect the emergency event based on a current level at the sense unit.

13. A power circuit comprising:
a switch coupled to a resistive-capacitive-inductive load;
a clamp; and
a driver coupled to the switch, wherein the driver comprises:
means for detecting an emergency event within the power circuit; and
means for performing a controlled emergency switch-off operation of the switch in response to the emergency event by at least limiting a voltage at the switch to a value that prevents the clamp from driving the switch into clamping operation and that prevents a rise in junction temperature of the switch, wherein the means for performing the controlled emergency switch-off operation comprise:
means for initiating a fast gate discharge of the switch;
means for detecting a current output of the switch;
means for ceasing the fast gate discharge of the switch in response to determining that the current output of the switch satisfies a current threshold; and
means for initiating a slow gate discharge of the switch after ceasing the fast gate discharge of the switch.

* * * * *